United States Patent [19]
Panis

[11] Patent Number: 5,938,780
[45] Date of Patent: Aug. 17, 1999

[54] METHOD FOR CAPTURING DIGITAL DATA IN AN AUTOMATIC TEST SYSTEM

[75] Inventor: Michael C. Panis, Brookline, Mass.

[73] Assignee: Teradyne, Inc., Boston, Mass.

[21] Appl. No.: 08/933,391

[22] Filed: Sep. 19, 1997

[51] Int. Cl.$^6$ .................................................. G01R 31/28
[52] U.S. Cl. ........................... 714/724; 714/731; 714/744
[58] Field of Search ..................................... 714/72.4, 731, 714/735, 742, 744, 718, 719; 375/226, 373, 360

[56] References Cited

U.S. PATENT DOCUMENTS

| | | | |
|---|---|---|---|
| 4,373,154 | 2/1983 | Balme et al. | 360/44 X |
| 4,821,297 | 4/1989 | Bergmann et al. | 375/120 |
| 5,598,446 | 1/1997 | Van Der Tuijn | 375/373 |

*Primary Examiner*—Hoa T. Nguyen
*Attorney, Agent, or Firm*—Richard E. Gamache

[57] ABSTRACT

A method for operating automatic test equipment for capturing digital data produced by a semiconductor device under test, whereby the digital data is repetitively sampled to produce a series of sampled data pairs. The digital data and the sampling frequency can be non-coherent. As a result, the digital data can be sampled early relative to some bits and late relative to other bits. The sampled data pairs that are captured while these shifts take place, from early-to-late sampling or from late-to-early sampling, are then assigned to respective groups. A minimum number of bit patterns, corresponding to the sampled digital data, is then derived from contiguous groups of sampled data pairs, and compared with expected bit patterns. The method is especially useful for capturing digital data with drifting frequency.

18 Claims, 23 Drawing Sheets

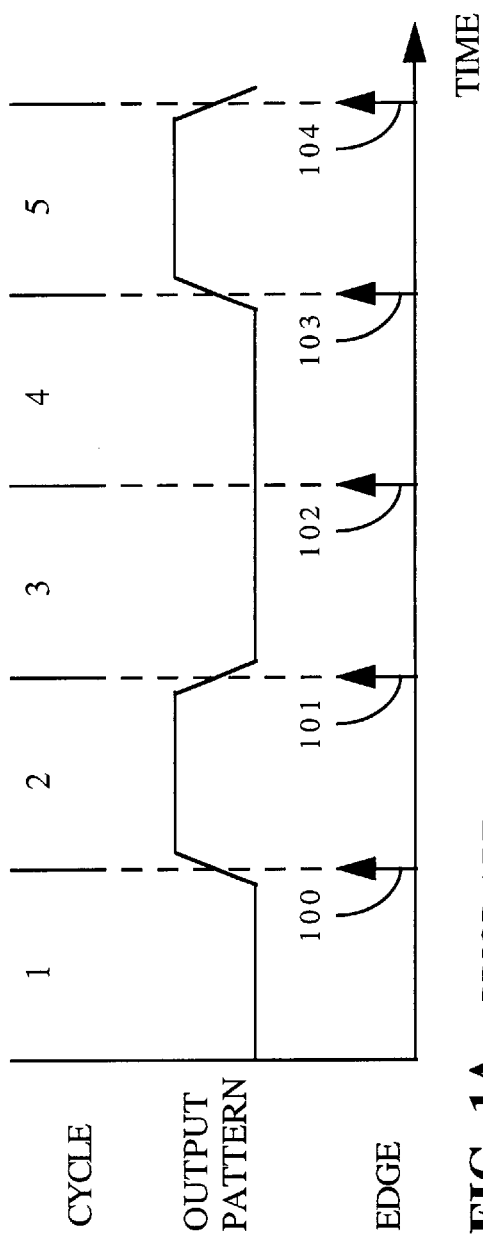
FIG. 1A - PRIOR ART
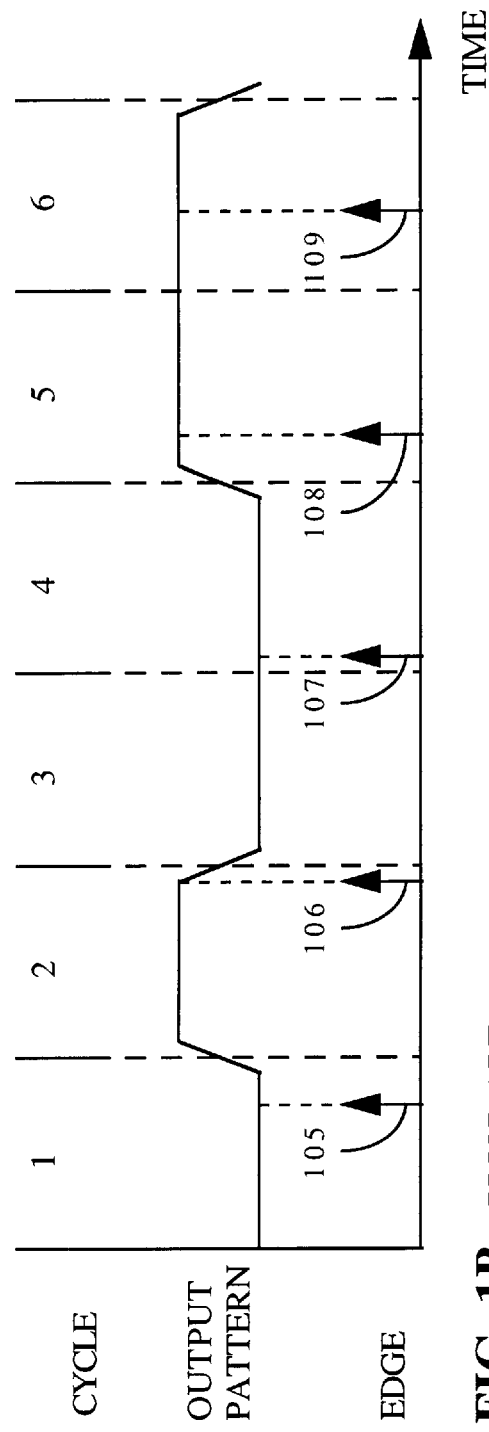
FIG. 1B - PRIOR ART

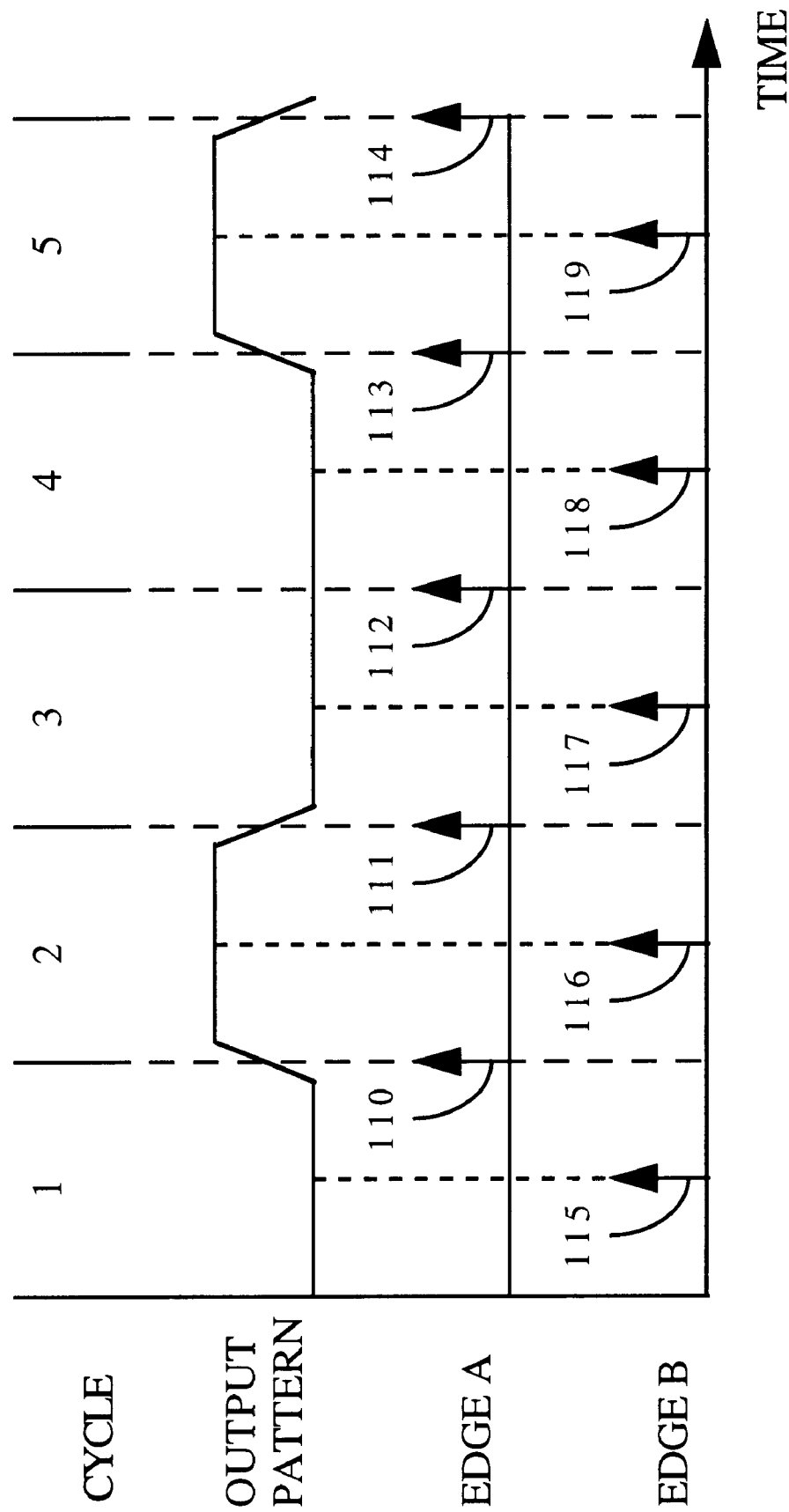
FIG. 1C - PRIOR ART

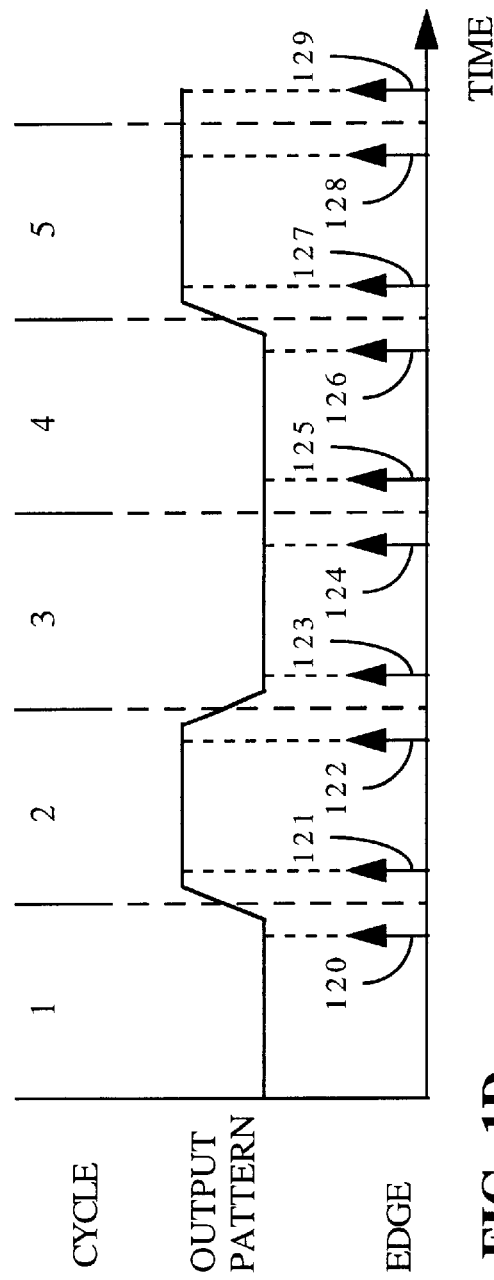
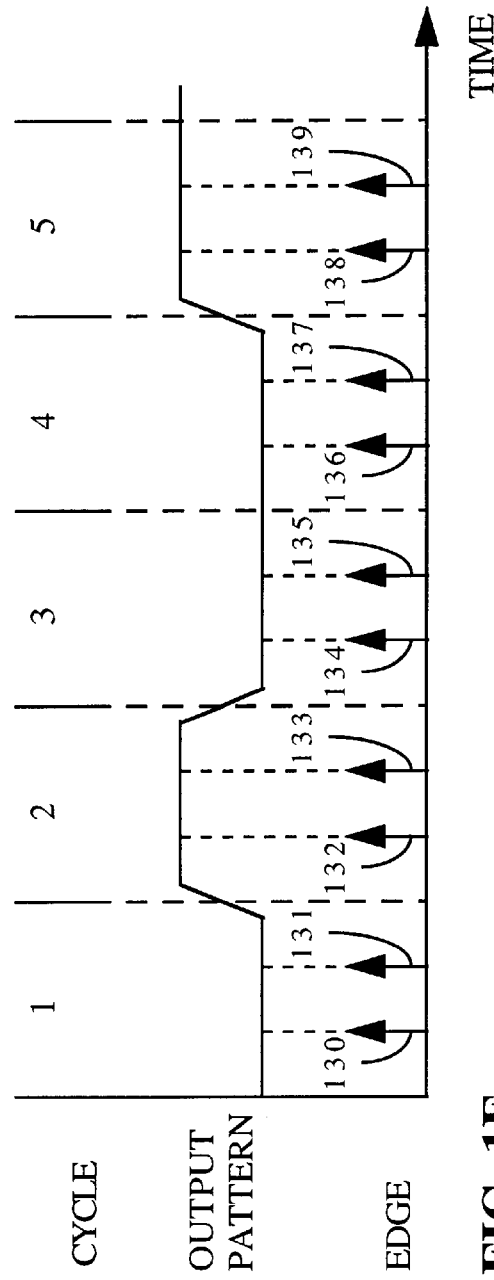
FIG. 1D - PRIOR ART
FIG. 1E - PRIOR ART

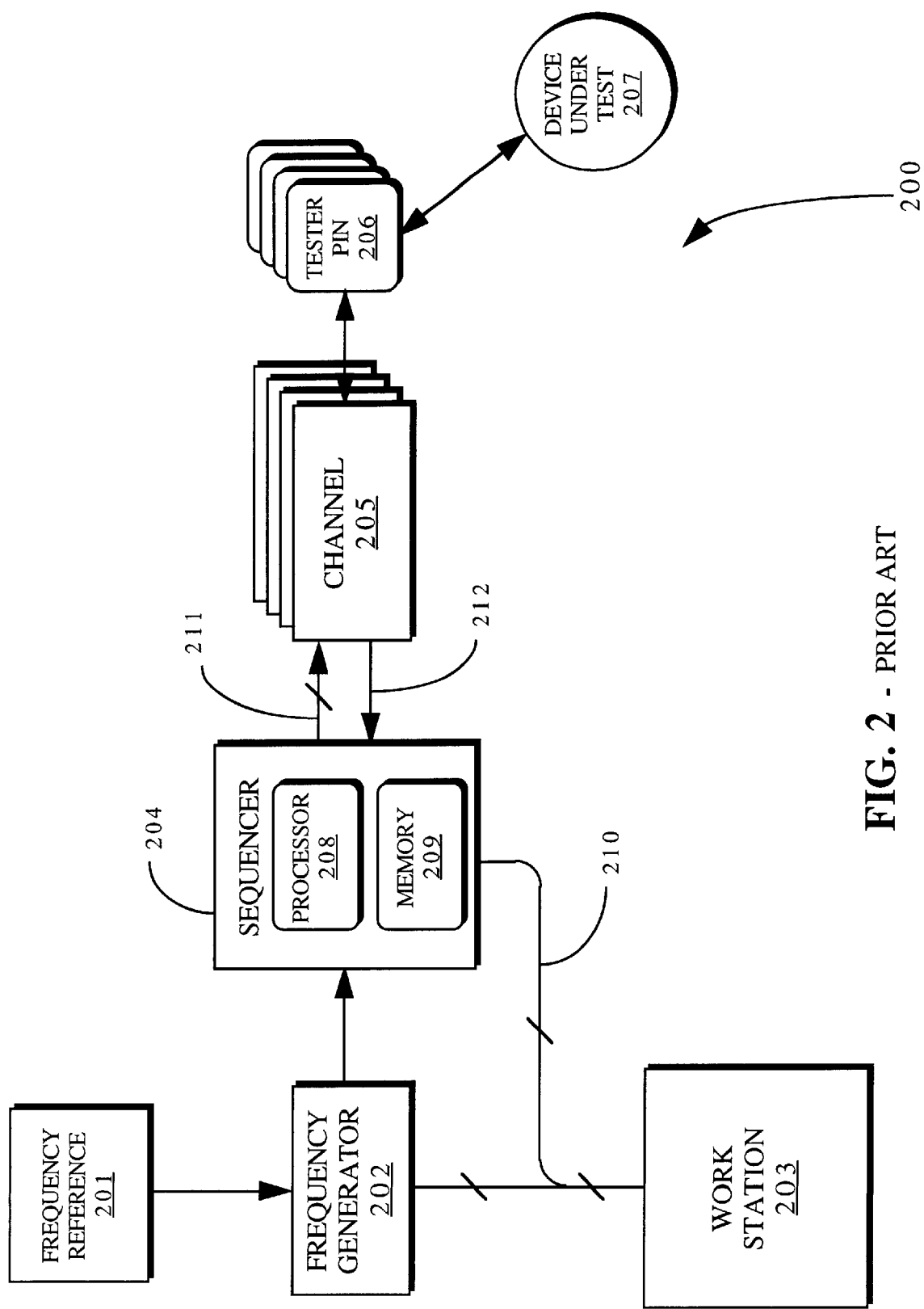
FIG. 2 - PRIOR ART

METHOD FOR CAPTURING DIGITAL DATA IN AN AUTOMATIC TEST SYSTEM

This invention relates generally to automatic test equipment, and more specifically to automatic test equipment for capturing digital data.

Automatic test equipment, also known as testers, are commonly used by semiconductor device manufacturers for determining whether semiconductor devices contain manufacturing defects. As a result, faulty semiconductor devices can be identified before they are incorporated into electronic assemblies or instruments. This is important because it is both easier and less costly to locate and either repair or replace faulty devices early in the manufacturing process. It also minimizes the chance that the electronic assemblies or instruments will fail prematurely in the field.

Testers generally include computerized control circuitry, driver and receiver channels, and tester pins, which connect the channels to electrical nodes of a semiconductor device under test (DUT). Further, testers generally apply test signals to selected nodes of the DUT, and capture output signals produced by the DUT in response to the test signals at other nodes of the DUT. Testers then generally compare the captured output signals with expected output signals, thereby determining whether the DUT is functioning properly.

Semiconductor devices that process both analog and digital signals are typically tested with testers that are capable of producing and receiving both analog and digital signals. Such devices are commonly called mixed-signal devices, and the testers that test these devices are known as mixed-signal testers. Accordingly, the captured output signals produced by the DUT may include analog signals, and digital signals, which typically take the form of digital data consisting of serial patterns of binary digits 0 and 1.

However, we have recognized that the precise times when the DUT might begin producing digital data during a test are usually unknown. Consequently, testers may not capture the digital data at optimal times, and incorrect patterns may then be stored in memory for subsequent analysis.

This is illustrated by the timing diagram shown in FIG. 1A, in which signal OUTPUT PATTERN represents a pattern of digital data that may be produced by the DUT in response to an applied test signal, and signals EDGE 100, 101, 102, 103, and 104 indicate times when a channel may sample signal OUTPUT PATTERN. For this example, the following bits of signal OUTPUT PATTERN occur during respective CYCLES 1 through 5: 0, 1, 0, 0, and 1. Also, the channel begins sampling signal OUTPUT PATTERN at the time indicated by signal EDGE 100, which occurs during a bit transition between CYCLE 1 and CYCLE 2.

Further, because signals OUTPUT PATTERN and EDGE are shown as coherent signals (i.e., signals OUTPUT PATTERN and EDGE have the same frequency), the channel also samples signal OUTPUT PATTERN during bit transitions at times indicated by signals EDGE 101, 103, and 104.

Accordingly, the logical values of the data sampled at times indicated by signals EDGE 100, 101, 103, and 104 are uncertain. Only during the time indicated by signal EDGE 102 can it definitely be said that the corresponding logical value of signal OUTPUT PATTERN is "low."

We have also recognized that OUTPUT PATTERN and EDGE may be non-coherent signals (i.e., OUTPUT PATTERN and EDGE have different frequencies). This is because OUTPUT PATTERN and EDGE are typically generated using different timing sources. As a result, even though the timing sources might be synchronized at the start of the test, OUTPUT PATTERN and EDGE will generally "drift apart" as the test progresses.

This is illustrated by the timing diagram shown in FIG. 1B. For this example, the following bits of OUTPUT PATTERN occur during the respective CYCLES 1 through 6: 0, 1, 0, 0, 1, and 1. Further, the channel begins sampling OUTPUT PATTERN at the time indicated by EDGE 105, which occurs during CYCLE 1, when the corresponding logical value of OUTPUT PATTERN is "low."

However, as mentioned above, OUTPUT PATTERN and EDGE are shown as non-coherent signals in FIG. 1B. In particular, the frequency of OUTPUT PATTERN is slightly faster than that of EDGE. As a result, EDGE 106 drifts to a slightly later position in time during CYCLE 2, relative to the position of EDGE 105 during CYCLE 1.

EDGE 107 also drifts, but in this case EDGE 107 occurs during, and near the start of, CYCLE 4. Because of the different frequencies of OUTPUT PATTERN and EDGE in this illustrative example, the channel does not sample OUTPUT PATTERN during CYCLE 3. Further, EDGE 108 drifts to a slightly later position in time during CYCLE 5, relative to the position of EDGE 107 during CYCLE 4. Similarly, EDGE 109 drifts to a slightly later position in time during CYCLE 6, relative to the position of EDGE 108 during CYCLE 5.

Accordingly, the following data is sampled at times indicated by EDGE 105, 106, 107, 108, and 109: 0, 1, 0, 1, and 1. Because this pattern does not match the bits of OUTPUT PATTERN occurring during CYCLES 1 through 6, subsequent analysis of this pattern stored in memory would yield incorrect results.

One method for capturing digital data in a tester is illustrated by the timing diagram shown in FIG. 1C. As before, OUTPUT PATTERN represents a pattern produced by the DUT in response to the applied test signal. However, instead of sampling and storing only one group of data, the channel samples and stores two groups of data at times indicated by EDGE A and EDGE B.

For the example shown in FIG. iC, the following bits of OUTPUT PATTERN occur during CYCLES 1 through 5: 0, 1, 0, 0, and 1. Further, OUTPUT PATTERN, EDGE A, and EDGE B are shown as coherent signals. As a result, the channel samples OUTPUT PATTERN during bit transitions at times indicated by EDGE A 110, 111, 113, and 114. Also, the channel samples OUTPUT PATTERN at approximately the midpoint of each CYCLE at times indicated by EDGE B 115, 116, 117, 118, and 119.

Accordingly, the logical values of the data sampled at times indicated by EDGE A 110, 111, 113, and 114 are uncertain. Only during the time indicated by EDGE A 112 can it definitely be said that the corresponding logical value of OUTPUT PATTERN is "low." The following first pattern is therefore sampled at times indicated by EDGE A: X, X, 0, X, and X, where the symbol, X, is used to show that the corresponding bit may be either 0 or 1. Also, the following second pattern is sampled at times indicated by EDGE B: 0, 1, 0, 0, and 1.

The first and second patterns are then stored either in separate regions of the same memory or in two distinct memories, and subsequently compared with an expected pattern. In particular, if either the first or second pattern matched the expected pattern, then the tester would use the matching pattern for the subsequent analysis. For the example shown in FIG. 1C, the second pattern, 01001, matches the bits of OUTPUT PATTERN occurring during CYCLES 1 through 5, which is typically the expected pattern.

However, this method has some drawbacks. First, instead of comparing just one stored pattern with the expected pattern, this method compares two patterns with the expected pattern. This substantially increases test time.

Also, this method is subject to "false passes." For example, the following bits of OUTPUT PATTERN might occur during CYCLES 1 through 5: 11001. Although this pattern does not match the expected pattern, 01001, the tester might mistakenly use it for the subsequent analysis. This is because the first pattern, which has uncertain logical values in the first, second, fourth, and fifth bit positions, might be stored in memory as the matching pattern, 11001.

Also, this method does not address the situation where OUTPUT PATTERN, and EDGE A and EDGE B are non-coherent signals, thereby causing OUTPUT PATTERN, and EDGE A and EDGE B to drift apart during the test.

Another method for capturing digital data is illustrated by the timing diagram shown in FIG. 1D and FIG. 1E. This method is used in Advanced Mixed-Signal Test Systems, such as the model A585, sold by TERADYNE®, Inc., Boston, Mass., USA. Whereas the method illustrated in FIG. 1C stores two patterns for subsequent comparing with the expected pattern, the method illustrated in FIG. 1D and FIG. 1E takes successive pairs of data samples, analyzes the sampled data pairs, and then stores only one pattern for subsequent comparison and analysis.

In particular, this method first analyzes sampled data pairs, which are acquired at times represented by EDGE pairs 120 and 121; 122 and 123; 124 and 125; 126 and 127; and, 128 and 129, for determining whether any sampled data pair occurs during a bit transition. For example, the following EDGE pairs occur during bit transitions from low-to-high or high-to-low: 120 and 121; 122 and 123; and, 126 and 127.

Because at least one of the analyzed EDGE pairs occurs during a bit transition, each EDGE pair is then shifted in time by an amount equal to approximately one half of the duration of a CYCLE. This is shown in FIG. 1E. The method then acquires sampled data pairs at times represented by EDGE pairs 130 and 131; 132 and 133; 134 and 135; 136 and 137; and, 138 and 139, and once again looks for bit transitions. Because none of these EDGE pairs occurs during a bit transition, the corresponding logical values for the sampled data pairs, i.e., 0, 1, 0, 0, and 1, are stored for subsequent comparison and analysis. As a result, because none of the stored logical values is uncertain, this method is not subject to false passes. Also, because only one pattern is compared with the expected pattern, and because most of the time no bit transitions are found during the initial analysis of the sampled data pairs, this method is usually faster than the method illustrated in FIG. 1C.

However, this method also has some drawbacks. For example, whenever an EDGE pair occurs during a bit transition, the EDGE pairs are shifted and bits are captured a second time, thereby increasing test time. This method also does not deal with the situation where OUTPUT PATTERN and EDGE are non-coherent signals, which drift apart during the test.

Although the background methods described above have been used for capturing digital data in testers, it would be desirable to have a method that reliably captures digital data, which is produced by a device under test at arbitrary times, without substantially increasing test time. It would also be desirable to have a method that quickly and reliably captures digital data when the digital data, and the tester signals used for sampling the digital data, drift apart during the test.

SUMMARY OF THE INVENTION

With the foregoing background in mind, it is an object of the invention to decrease the time required for capturing digital data in automatic test equipment.

Another object of the invention is to provide a fast and reliable way of capturing digital data that is produced by a device under test at arbitrary times.

Still another object of the invention is to provide a fast and reliable way of capturing digital data when the digital data, and the signals used for sampling the digital data, drift apart during a test.

The foregoing and other objects are achieved by repetitively sampling the digital data to produce a series of sampled data pairs. Each sampled data pair is then assigned to one of a plurality of groups. Corresponding first and last sampled data pairs in each group are designated as having been acquired either early or late relative to associated bits in the digital data. Designations that are invalid relative to a measured amount of drift in the digital data are then eliminated. The remaining designations are then used for designating remaining sampled data pairs in each group as having been acquired either early or late relative to other associated bits in the digital data. Serial bit patterns are then derived from the designations of the sampled data pairs in contiguous groups. Finally, the serial bit patterns are compared with expected bit patterns.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a timing diagram describing a capture of digital data produced by a device under test at an arbitrary time, FIG. 1B is a timing diagram describing the capture of digital data with drifting frequency, FIG. 1C is a timing diagram describing the capture of digital data using a background method, FIG. 1D is a timing diagram describing the capture of digital data using another background method, FIG. 1E is a timing diagram further describing the method of FIG. 1D, FIG. 2 is a partial block diagram of a typical tester.

DESCRIPTION OF THE PREFERRED EMBODIMENT

Figure 3A:
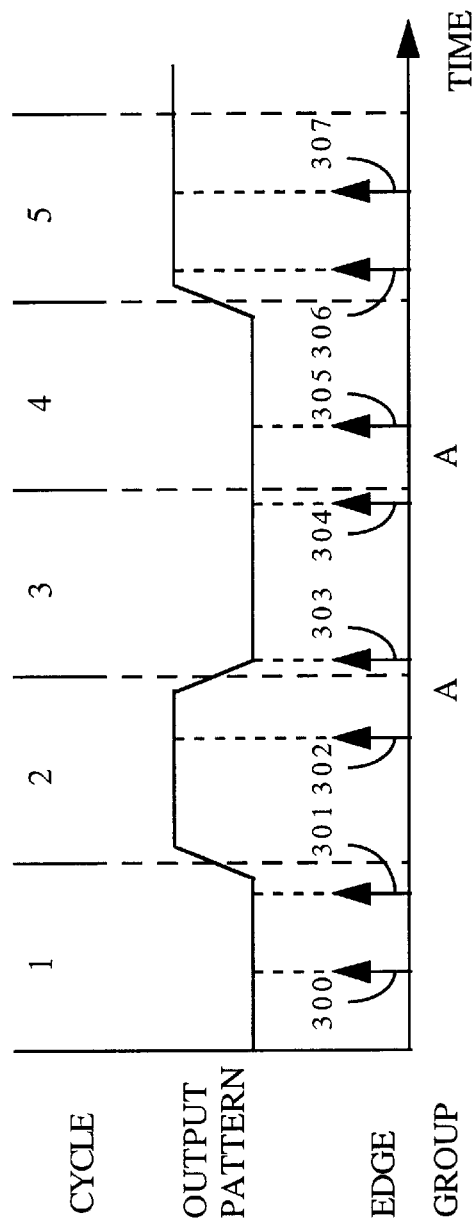
FIG. 3A is a timing diagram describing a capture of digital data in accordance with the present invention.

FIG. 2 shows a partial block diagram of tester 200, which is useful for capturing digital data produced by DUT 207. A test engineer typically develops test programs, which generally include series of test vectors, on computer work station 203. The test engineer also typically enters commands for either starting a test or specifying operating parameters on work station 203. For example, the test engineer may specify frequencies of test system clock signals generated by frequency generator 202, thereby specifying test cycle times. Frequency generator 202 is coupled to vector sequencer 204 and frequency reference 201, which provides a reference for the test system clock.

The test engineer then typically loads the test programs into memory 209, included in vector sequencer 204, over system bus 210. During a specified test cycle, processor 208, also included in sequencer 204, reads the test vectors from memory 209, and then sends data values, timing information, and format information, each of which are included in the test vectors, to channel 205 over internal bus 211. As shown, channel 205 is one of a plurality of channels included in tester 200.

In a typical test configuration, the data values indicate logical values of data bits, and the timing information indicates amounts of time by which the data values are delayed relative to the beginning of the specified test cycle. Also, the format information indicates whether the data values are to be applied to or captured at nodes of DUT 207. Accordingly, channel 205 includes circuitry (not shown) for both applying test data to DUT 207 and for receiving or capturing output data produced by DUT 207 at the indicated times. Tester pin 206 connects channel 205 to a node of DUT 207. The number of tester pins is generally equal to the number of channels in tester 200.

Tester 200 then compares captured bit patterns with expected bit patterns, which are also typically stored in memory 209. This function may be implemented, for example, in software using processor 208, which responds to a series of programmed steps. It may alternatively be implemented using circuitry (not shown) for detecting and comparing bit patterns, which is typically included in sequencer 204. Finally, if the captured bit patterns match the expected bit patterns, then tester 200 would normally indicate that DUT 207 is functioning properly.

Work station 203, sequencer 204, frequency generator 202, frequency reference 201, channel 205, and tester pin 206 represent components that are included in conventional testers. Accordingly, the construction of these components is known to those skilled in this art. For this reason, specific implementations of these components are not critical to the present invention.

FIG. 3A shows a timing diagram of typical signals generated by tester 200 and DUT 207. DUT 207 produces OUTPUT PATTERN in response to test signals (not shown) generated by tester 200. Further, tester 200 acquires sampled data pairs at times represented by EDGE pairs 300 and 301; 302 and 303; 304 and 305; and, 306 and 307. EDGE signals in each EDGE pair are preferably separated in time by one half of the duration of one bit in OUTPUT PATTERN, which is equal to the duration of a CYCLE in this illustrative example.

For the example shown in FIG. 3A, the following bits of OUTPUT PATTERN occur during CYCLES 1 through 5: 0, 1, 0, 0, and 1. Further, OUTPUT PATTERN and EDGE are shown as noncoherent signals. In particular, the frequency of OUTPUT PATTERN is slightly faster than that of EDGE. This means that although OUTPUT PATTERN and EDGE might be synchronized at the start of a test, they will generally drift apart as the test progresses. Accordingly, the logical values of the data sampled by EDGE pairs 300 and 301; 302 and 303; 304 and 305; and, 306 and 307, respectively, are as follows: (LL), (HL), (LL), and (HH).

The timing diagram of FIG. 3A illustrates some of the ideas that are used in the method of the present invention. In particular, one action in the method described herein includes determining whether a sampled data pair, which occurs during a bit transition, might have been acquired either early or late relative to a specific bit in OUTPUT PATTERN.

For example, EDGE pair 302 and 303 occurs during the bit transition between CYCLES 2 and 3. As a result, the logical values of the data sampled by EDGE pair 302 and 303 are (HL); i.e., they are different. It is therefore determined whether EDGE pair 302 and 303 might have occurred either late or early relative to the bits occurring during either CYCLE 2 or 3.

Accordingly, if EDGE pair 302 and 303 might have occurred late relative to the bit occurring during CYCLE 2, then the first element of the corresponding sampled data pair, i.e., a 1 bit, would be stored for subsequent analysis. Alternatively, if EDGE pair 302 and 303 might have occurred early relative to the bit occurring during CYCLE 3, then the second element of the corresponding sampled data pair, i.e., a 0 bit, would be stored instead.

Another action in the method described herein includes assigning particular adjacent sampled data pairs to groups. In particular, because OUTPUT PATTERN and EDGE are shown as non-coherent signals in FIG. 3A, they will generally drift apart as the test progresses. As a result, EDGE pairs may first occur early for some bits in OUTPUT PATTERN. Further, as OUTPUT PATTERN and EDGE drift apart, EDGE pairs may occur late for other successive bits in OUTPUT PATTERN. Alternatively, the EDGE pairs may first occur late for some bits, and then occur early for successive bits as the test progresses. The adjacent sampled data pairs that are acquired while these shifts are taking place, from early-to-late or from late-to-early, are assigned to the same group.

Also, EDGE pairs that occur during bit transitions signify the start of groups. For example, EDGE pair 302 and 303, occurring during the bit transition between CYCLES 2 and 3, signifies the start of GROUP A for the illustrative example shown in FIG. 3A.

Also, complete shifts, from early-to-late or from late-to-early, signify the end of groups. For example, EDGE pairs 302 and 303; and, 304 and 305 each occur late relative to bits occurring during CYCLES 2 and 3, respectively. Further, EDGE pair 306 and 307 occurs near the start of CYCLE 5. Although EDGE pair 306 and 307 does not occur during a bit transition, it can be described as occurring early during CYCLE 5. This shift from late-to-early, denoted by sampled data pairs 0,0 and 1,1 occurring during times represented by EDGE pairs 304 and 305; and, 306 and 307, signifies the end of GROUP A. Accordingly, the adjacent sampled data pairs acquired at times represented by EDGE pairs 302 and 303; and, 304 and 305, which occur late relative to the corresponding bits in OUTPUT PATTERN, are each assigned to GROUP A.

Still another action in the method described herein includes storing elements of each sampled data pair for subsequent analysis. For example, the logical values of the data pair sampled by EDGE pair 300 and 301 are (LL). A 0 bit is therefore stored for subsequent analysis.

Also, as mentioned above, the sampled data pairs assigned to GROUP A each occur late. This means that the first element of each sampled data pair in GROUP A, i.e., a 1 bit and a 0 bit, are stored for subsequent analysis.

However, for the illustrative example shown in FIG. 3A, the last sampled data pair in GROUP A is also viewed as occurring early relative to the bit occurring during CYCLE 4. This is because the frequency of OUTPUT PATTERN is slightly faster than that of EDGE. As a result, the last sampled data pair in GROUP A samples bits occurring during both CYCLE 3 and 4. This means that the second element of the data pair sampled by EDGE pair 304 and 305, i.e., a 0 bit, is also stored for subsequent analysis.

Finally, the logical values of the data pair sampled by EDGE pair 306 and 307 are (HH). A 1 bit is therefore stored for subsequent analysis. The following pattern of bits is therefore stored: 01001. This pattern matches the expected pattern, 01001.

Figure 3B:
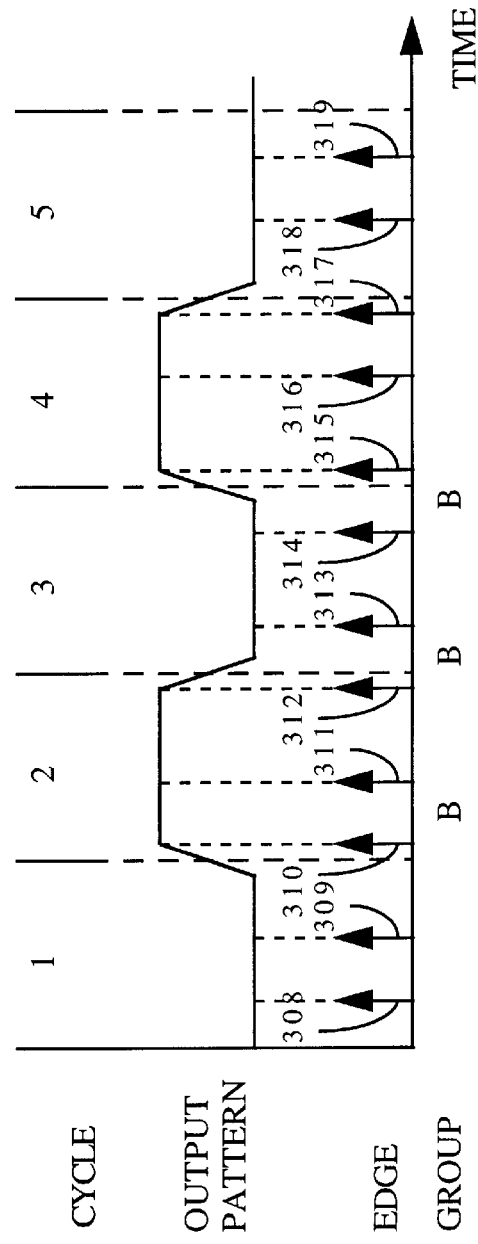
FIG. 3B is a timing diagram describing another capture of digital data in accordance with the present invention.

The timing diagram of FIG. 3B also illustrates some of the ideas that are used in the method described herein. In particular, the following bits of OUTPUT PATTERN occur during CYCLES 1 through 5: 0, 1, 0, 1, and 0.

OUTPUT PATTERN and EDGE are also shown as non-coherent signals in FIG. 3B. In particular, the frequency of OUTPUT PATTERN is now slightly slower than that of EDGE. This means that OUTPUT PATTERN and EDGE will once again drift apart as the test progresses. Accordingly, the logical values of the data sampled by EDGE pairs 308 and 309; 310 and 311; 312 and 313; 314 and 315; 316 and 317; and, 318 and 319, respectively, are as follows: (LL), (HH), (HL), (LH), (HH), and (LL).

EDGE pair 312 and 313 occurs during a bit transition and therefore signifies the start of GROUP B. However, whereas the sampled data pair acquired at the times represented by EDGE pair 302 and 303 was the first data pair in GROUP A, the sampled data pair acquired at the times represented by EDGE pair 312 and 313 is not the first data pair in GROUP B. This is because EDGE pair 312 and 313 is immediately preceded by EDGE pair 310 and 311, in which the logical values of the sampled data are the same as the logical value of the first element of the sampled data pair sampled by EDGE pair 312 and 313. As a result, EDGE pairs 310 and 311; 312 and 313; and, 314 and 315 each occur early relative to bits occurring during CYCLES 2, 3, and 4, respectively. The sampled data pair acquired at the times represented by EDGE pair 310 and 311 is therefore the first data pair in GROUP B.

Further, although EDGE pair 316 and 317 does not occur during a bit transition, it can be described as occurring late during CYCLE 4. This shift from early-to-late, denoted by sampled data pairs 1,1 and 0,0 occurring during times represented by EDGE pairs 316 and 317; and, 318 and 319, signifies the end of GROUP B. Accordingly, the adjacent sampled data pairs acquired at times represented by EDGE pairs 310 and 311; 312 and 313; and, 314 and 315, which occur early relative to the corresponding bits in OUTPUT PATTERN, are each assigned to GROUP B.

It follows that a 0 bit is stored for the data pair sampled by EDGE pair 308 and 309. Further, because the sampled data pairs in GROUP B each occur early, the second element of each of these sampled data pairs is stored; i.e., 1, 0, and 1.

However, for the illustrative example shown in FIG. 3B, no bits are stored for the data pair sampled by EDGE pair 316 and 317. This is because the frequency of OUTPUT PATTERN is slightly slower than that of EDGE. As a result, both the last sampled data pair of GROUP B, and the data pair sampled by EDGE pair 316 and 317, sample the bit occurring during CYCLE 4. For this reason, the data pair sampled by EDGE pair 316 and 317 is ignored.

Finally, a 0 bit is stored for the data pair sampled by EDGE pair 318 and 319. The following pattern of bits is therefore stored for subsequent analysis: 01010. This pattern matches the expected pattern, 01010.

The determining of whether a sampled data pair might have occurred either early or late relative to a particular bit, the assigning of particular adjacent sampled data pairs to groups, and the storing of particular elements of each sampled data pair for subsequent analysis, as described above, are meant to introduce some of the ideas that are used in the method of the present invention. A more detailed discussion of these ideas is included in the following description of the preferred embodiment of the method for capturing digital data, which is implemented in accordance with the procedure shown in FIGS. 4A through 4R.

Figure 4A:
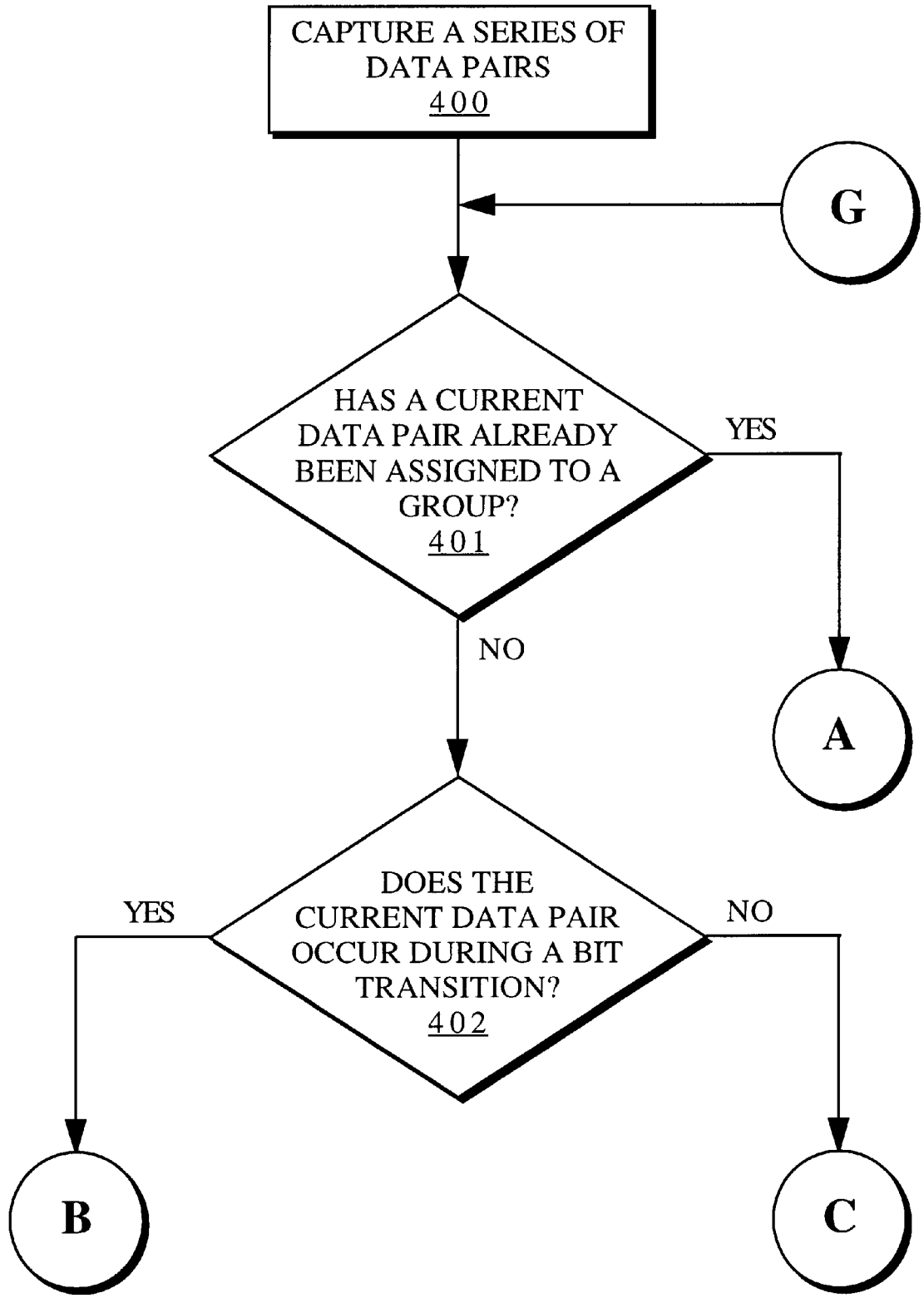
FIGS. 4A through 4R is a detailed flowchart describing the method of capturing digital data in accordance with the present invention.

First, as shown in FIG. 4A, digital data, which is produced by the device under test and generally consists of a serial pattern of bits, is repetitively sampled in block 400 for capturing a series of sampled data pairs. Once again, corresponding signals OUTPUT PATTERN and EDGE are assumed to be non-coherent signals. Further, TABLE I below indicates the logical values of fourteen sampled data pairs, which may typically be captured in block 400.

TABLE I

| | LOGICAL VALUES OF SAMPLED DATA PAIRS | GROUP |
|---|---|---|
| 1 | (L L) | |
| 2 | (H L) | C |
| 3 | (L L) | C |
| 4 | (H H) | D |
| 5 | (H L) | D |
| 6 | (L H) | D |
| 7 | (L L) | |
| 8 | (H H) | E |
| 9 | (H L) | E |
| 10 | (L L) | E |
| 11 | (L H) | E |
| 12 | (H H) | |
| 13 | (H H) | |
| 14 | (H H) | |

Figure 4B:
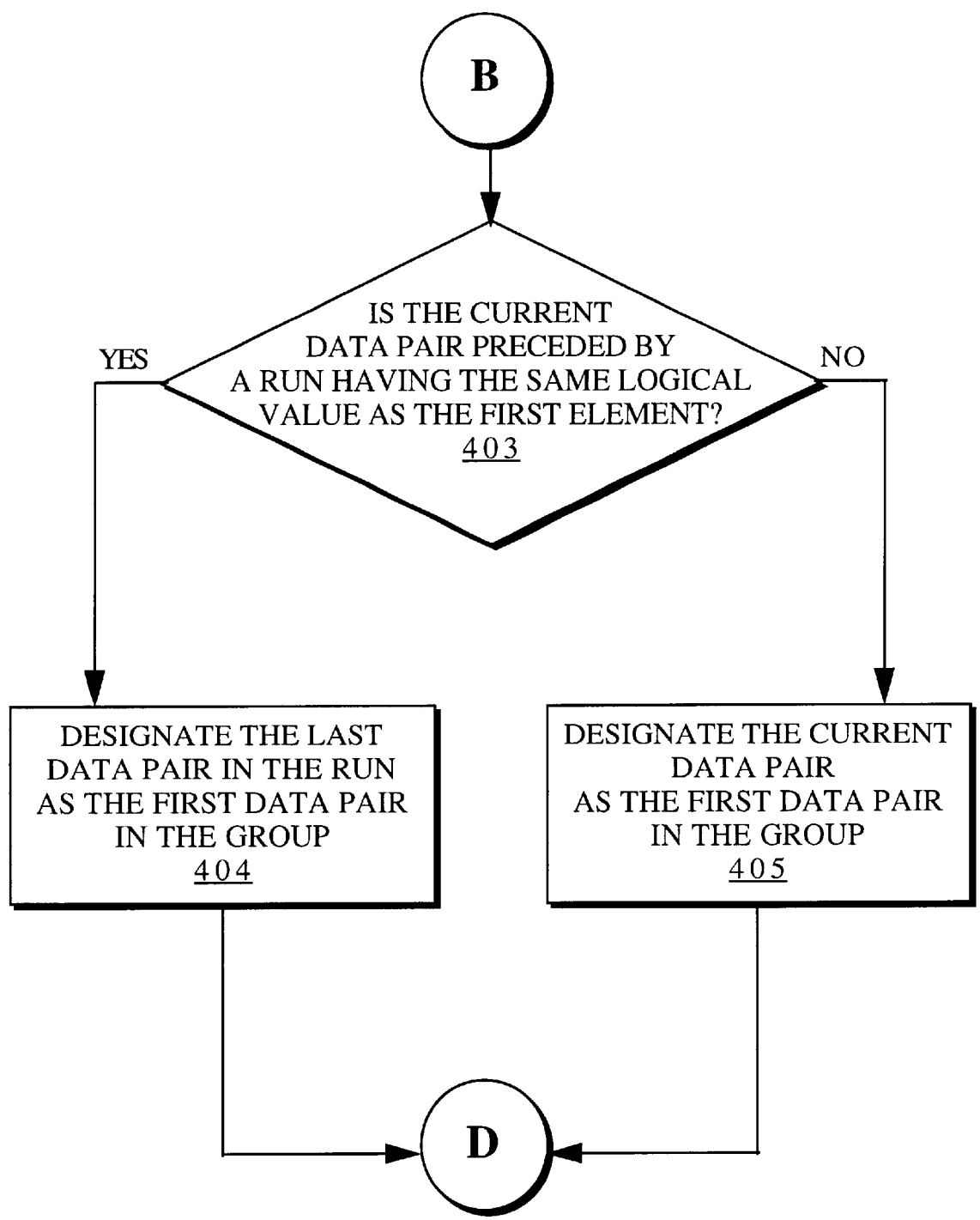
Figure 4C:
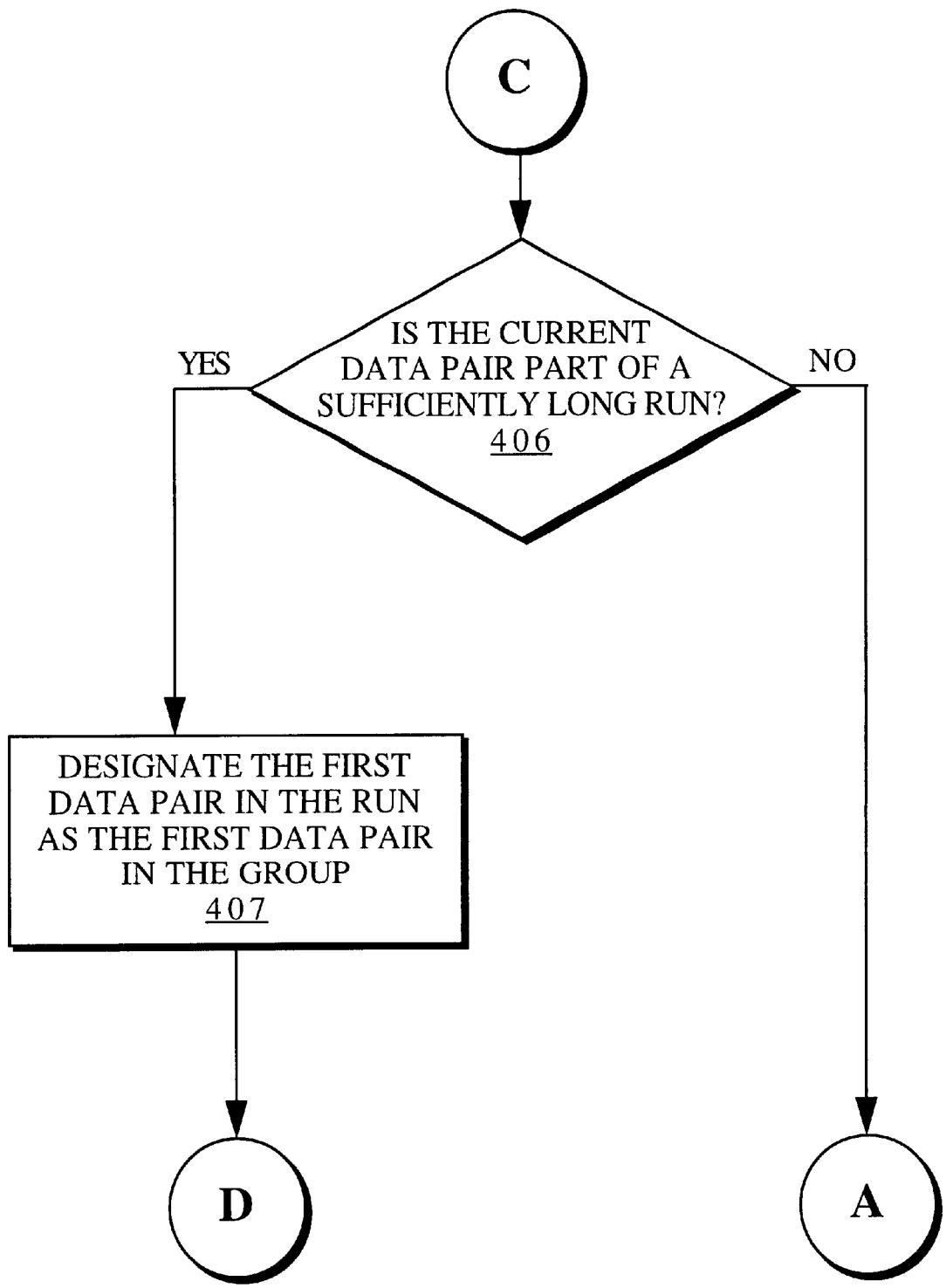
Figure 4D:
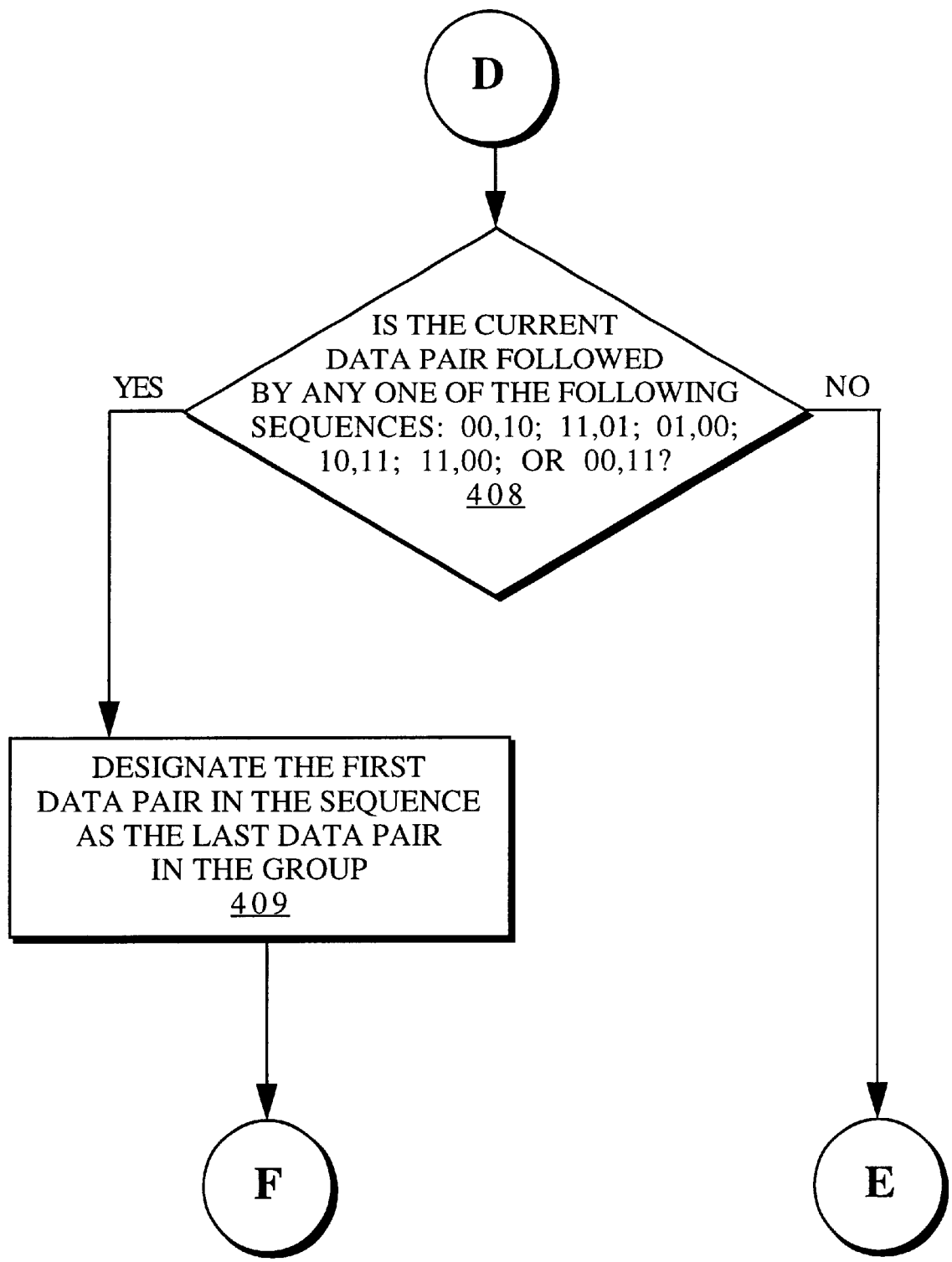
Figure 4E:
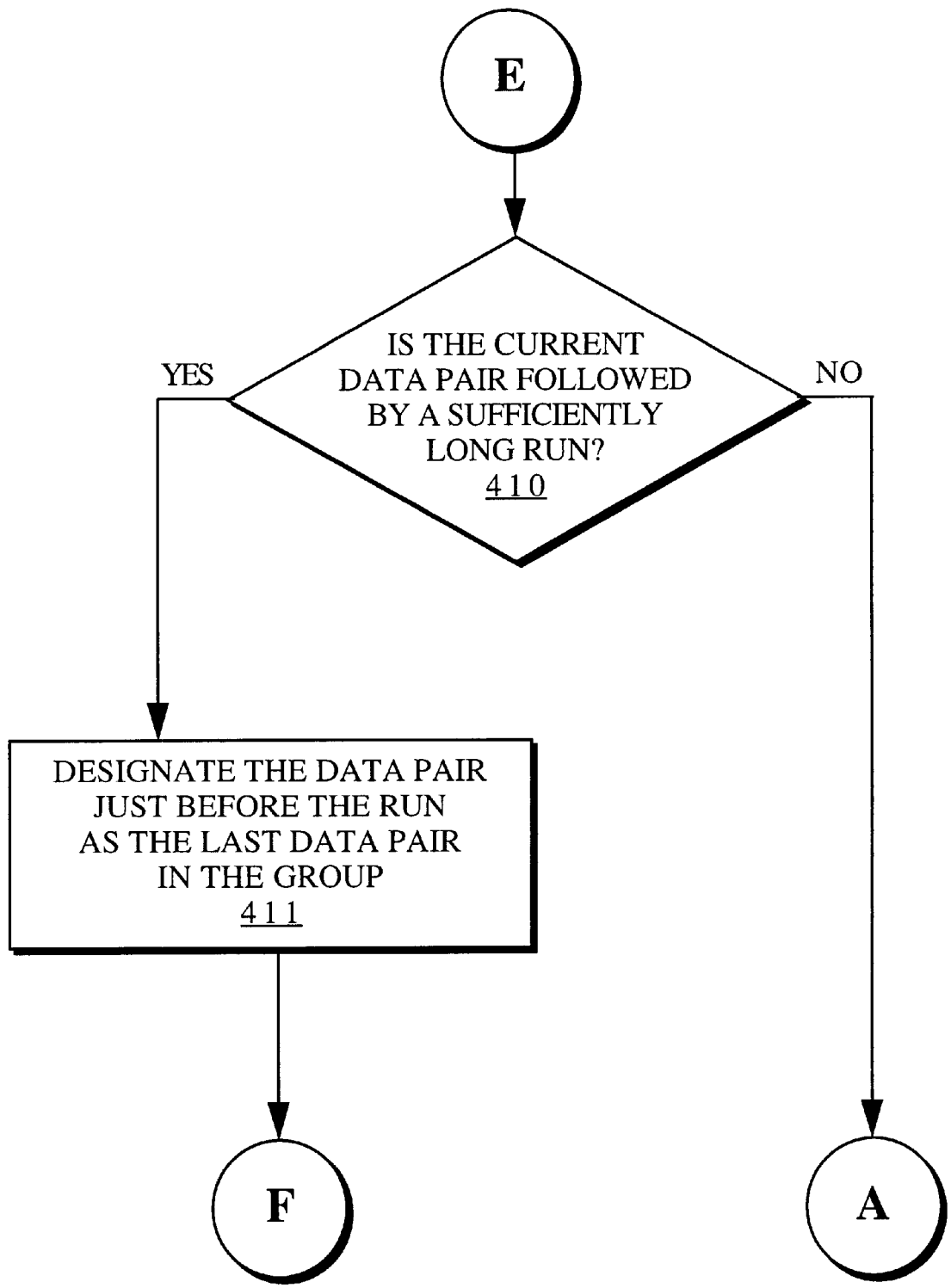
Figure 4F:
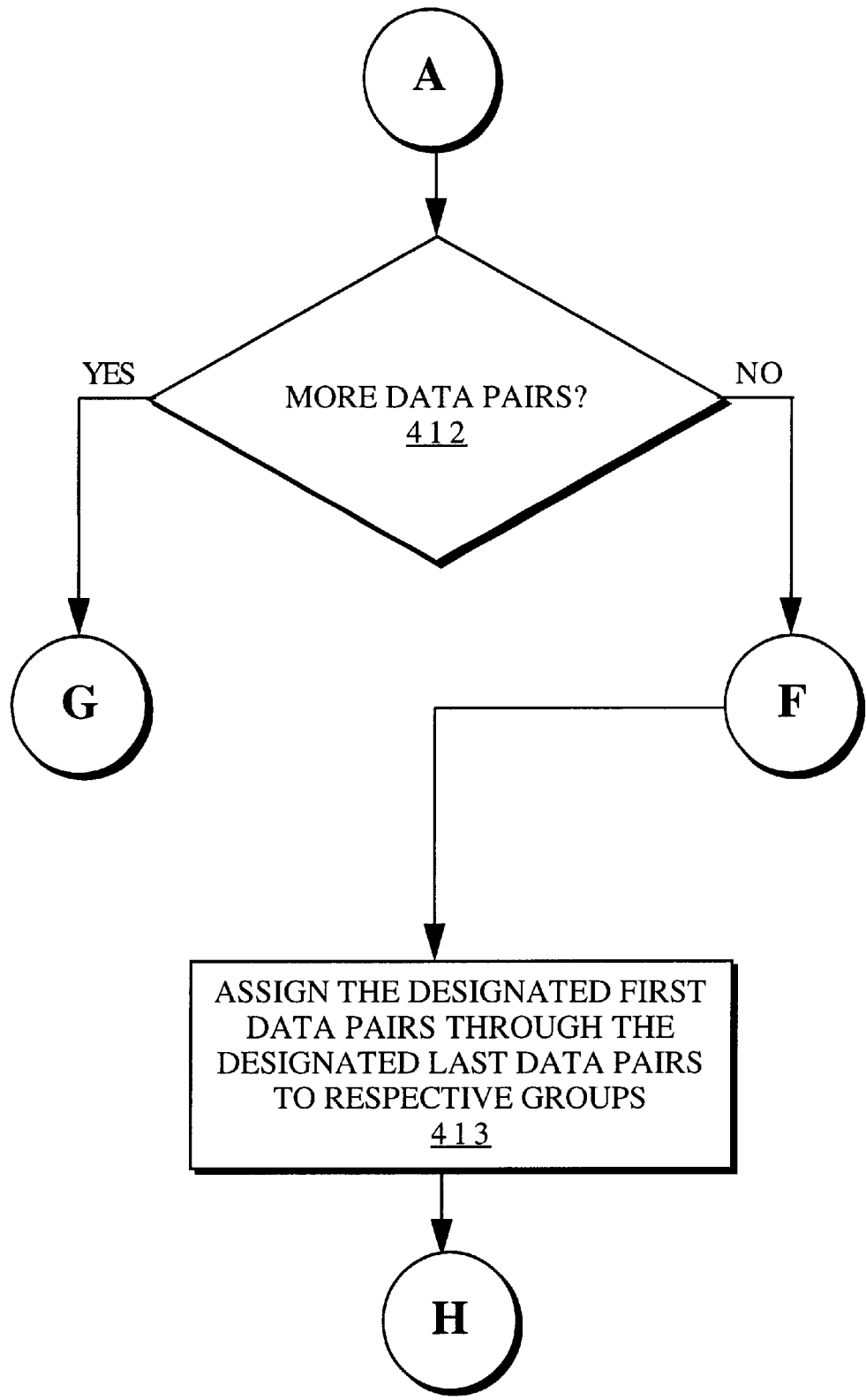

Next, the action of assigning particular adjacent sampled data pairs to groups is described in blocks 401 through 413, as shown in FIGS. 4A through 4F. For example, whether a current sampled data pair has already been assigned to a group is determined in decision block 401. If so, the procedure branches to decision block 412, as shown in FIG. 4F.

Otherwise, the procedure continues to decision block 402, which determines whether the current sampled data pair occurs during a bit transition. As described above, sampled data pairs that occur during bit transitions can signify the start of groups. For example, the second, fifth, sixth, ninth, and eleventh sampled data pairs listed in TABLE I occur during bit transitions. This is because the logical values in each of these sampled data pairs are different.

If the current sampled data pair occurs during a bit transition, then the procedure branches to decision block 403, which is shown in FIG. 4B and determines whether the current data pair is preceded by a "run" having the same logical value as the first element of the current data pair. A run is one or more adjacent sampled data pairs with the same logical value for each element; e.g., (LL), (LL) or (HH), (HH). For example, the fifth and the ninth sampled data pair listed in TABLE I are each preceded by a run (consisting of a single sampled data pair) having the same logical value as the first element in the fifth and the ninth sampled data pairs, which is "high" for both cases.

Accordingly, the procedure then branches to block 404, which designates the last sampled data pair in the run as the first sampled data pair in a corresponding group. For example, the runs preceding the fifth and the ninth sampled data pairs each consist of a single sampled data pair. As a result, as shown in TABLE I, the fourth sampled data pair is designated as the first sampled data pair in GROUP D, and the eighth sampled data pair is designated as the first sampled data pair in GROUP E. This was also illustrated in FIG. 3B, in which the sampled data pair acquired at the times represented by EDGE pair 310 and 311 was designated as the first sampled data pair in GROUP B.

Alternatively, if the current sampled data pair is not preceded by a run having the same logical value as the first element in the current sampled data pair, then the procedure branches to block 405, which designates the current sampled data pair as the first sampled data pair in the corresponding group. For example, the run preceding the second sampled data pair listed in TABLE I does not have the same logical value as the first element in the second sampled data pair. As a result, the second sampled data pair is designated as the first sampled data pair in GROUP C. This was also illustrated in FIG. 3A, in which the sampled data pair acquired at times represented by EDGE pair 302 and 303 was designated as the first sampled data pair in GROUP A.

However, if it is determined in decision block 402 that the current sampled data pair does not occur during a bit transition, then the procedure branches to decision block 406, which is shown in FIG. 4C and determines whether the current sampled data pair is part of a sufficiently long run. This is because during sufficiently long runs, EDGE pairs might shift from early-to-late or from late-to-early with no EDGE pairs occurring during a bit transition. As a result, starting points of groups might go undetected.

The number of sampled data pairs in a sufficiently long run is equal to the minimum number of sampled data pairs required for the EDGE pairs to drift from early-to-late or from late-to-early. This can be determined during a typical test using the known frequency of EDGE, f1, and a measured frequency of OUTPUT PATTERN, f2.

In particular, EDGE can be viewed as sampling OUTPUT PATTERN while drifting across OUTPUT PATTERN with an effective time between samples being equal to $|(1/f1)-(1/f2)|$. For example, when f2 is slightly faster than f1, EDGE may drift from a position that is late in a bit period, through a bit transition, and then to a position that is early in another bit period.

This is shown in FIG. 3A, in which EDGE pairs 300 and 301; 302 and 303; and 304 and 305 drift from late-to-early. Further, the minimum number of sampled data pairs required for EDGE pairs 300 and 301; 302 and 303; and 304 and 305 to drift from late-to-early is approximately equal to the number of samples required to drift the effective amount of time in one half of the duration of one bit in OUTPUT PATTERN, which is equal to one half of the duration of a CYCLE in FIG. 3A.

As an illustrative example, let f2 be equal to 200 MHz, and let f1 be equal to 172 MHz. As a result, EDGE samples OUTPUT PATTERN while drifting across OUTPUT PATTERN with the effective time between samples being equal to $|(1/172\text{ MHz})-(1/200\text{ MHz})|$, or 0.814 nsecs. Also, one half of the duration of one bit in OUTPUT PATTERN would be equal to $(1/2)(1/200\text{ MHz})$, or 2.5 nsecs. It would therefore take at least three samples (i.e., (2.5 nsecs)÷(0.814 nsecs)) for EDGE pairs 300 and 301; 302 and 303; and 304 and 305 to drift the effective amount of time in one half of the duration of one bit in OUTPUT PATTERN. This is also the number of sampled data pairs in a sufficiently long run for this illustrative example.

Accordingly, if the current sampled data pair were part of a run of at least 3 sampled data pairs, then the procedure would branch to block 407, which designates the first sampled data pair in the run as the first sampled data pair in the corresponding group. Otherwise, if the current sampled data pair were not part of a sufficiently long run, then the procedure would branch to decision block 412, which is shown in FIG. 4F.

After the first sampled data pair is designated in the corresponding group in either block 404, 405, or 407, the procedure then branches to decision block 408 shown in FIG. 4D, which is shown in FIG. 4D and determines whether the current sampled data pair is followed by any one of the following sampled data pair sequences: (LL)(HL), (HH)(LH), (LH)(LL), (HL)(HH), (HH)(LL), or (LL)(HH). Although any one of these pair sequences might immediately follow the current sampled data pair, they may be separated from the current sampled data pair by at least one other sampled data pair. Further, these sampled data pair sequences would typically be detected at the end of shifts from early-to-late or from late-to-early, thereby signifying the end of a current group.

In particular, the sampled data pair sequences (LL)(HL) and (HH)(LH) signify that the current group has ended and a new group has begun. For this case, the second sampled data pair in each sequence is considered to have occurred late relative to a corresponding bit. This was illustrated in FIG. 3A, in which the sampled data pair acquired at times represented by EDGE pair 300 and 301 might have signified the end of a previous group and the sampled data pair acquired at times represented by EDGE pair 302 and 303 signified the start of GROUP A.

Further, the sampled data pair sequences (HH)(LL) and (LL)(HH) signify that the current group has ended. This was also illustrated in FIG. 3A, in which the sampled data pairs acquired at times represented by EDGE pair 304 and 305 and EDGE pair 306 and 307 signified the end of GROUP A.

The sampled data pair sequences (LH)(LL) and (HL)(HH) also signify the end of the current group. For this case, the first sampled data pair in each sequence is considered to have occurred early relative to a corresponding bit.

If the current sampled data pair were followed by any one of the sampled data pair sequences (LL)(HL), (HH)(LH), (LH)(LL), (HL)(HH), (HH)(LL), or (LL)(HH), then the procedure would branch to block 409, which designates the first sampled data pair in the sequence as the last sampled data pair in the current group.

This was illustrated in FIG. 3A, in which the sampled data pair sequence acquired at times represented by EDGE pair 304 and 305 and EDGE pair 306 and 307 signified the end of GROUP A, and the sampled data pair acquired at the time represented by EDGE pair 304 and 305 was designated as the last sampled data pair of GROUP A.

Also, as shown in TABLE I, the first sampled data pair of GROUP C (sample 2) is followed by the sequence (LL)(HH), which are samples 3 and 4. Accordingly, sample 3 is designated as the last sampled data pair of GROUP C.

Also, as shown in TABLE I, the first sampled data pair of GROUP D (sample 4) is followed by the sequence (LH)(LL), which are samples 6 and 7. Accordingly, sample 6 is designated as the last sampled data pair of GROUP D.

However, if the current sampled data pair were not followed by any one of the sampled data pair sequences (LL)(HL), (HH)(LH), (LH)(LL), (HL)(HH), (HH)(LL), or (LL)(HH), then the procedure would branch to block 410, which is shown in FIG. 4E and determines whether the current data pair is followed by a sufficiently long run. This is because during sufficiently long runs, EDGE pairs might shift from early-to-late or from late-to-early with no EDGE pairs occurring during a bit transition. As a result, end points of groups might go undetected.

It was described above that the number of sampled data pairs in a sufficiently long run is equal to the minimum number of sampled data pairs required for the EDGE pairs to drift from early-to-late or from late-to-early. Also, although a sufficiently long run might immediately follow the current sampled data pair, it may be separated from the current sampled data pair by at least one other sampled data pair.

If the current sampled data pair were followed by a sufficiently long run, then the procedure would branch to block 411, which designates the sampled data pair immediately before the start of the run as the last sampled data pair in the current group.

As shown in TABLE I, the first sampled data pair of GROUP E (sample 8) is followed by a run consisting of samples 12 through 14, which is a sufficiently long run for this illustrative example. Accordingly, sample 11 is designated as the last sampled data pair of GROUP E.

If the current sampled data pair were not followed by a sufficiently long run, then the procedure would branch to decision block 412, which is shown in FIG. 4F and determines whether there are any more sampled data pairs that might be assigned to a group. If so, then the procedure branches back to decision block 401 shown in FIG. 4A. If not, then the procedure instead branches to block 413, which assigns consecutive sampled data pairs, from each designated first sampled data pair to each corresponding last sampled data pair, inclusive, to respective groups.

For example, the designated first and last sampled data pairs of GROUP C (samples 2 and 3, respectively) are assigned to GROUP C. Also, the designated first and last sampled data pairs of GROUP D (samples 4 and 6, respectively), and the sampled data pair between the designated first and last pairs (sample 5), are assigned to GROUP D. Also, the designated first and last sampled data pairs of GROUP E (samples 8 and 11, respectively), and the sampled data pairs between the designated first and last pairs (samples 9 and 10), are assigned to GROUP E. Finally, samples 1, 7, 12, 13, and 14, which have logical values (LL), (LL), (HH), (HH), and (HH), respectively, are not assigned to any groups.

Figure 4G:
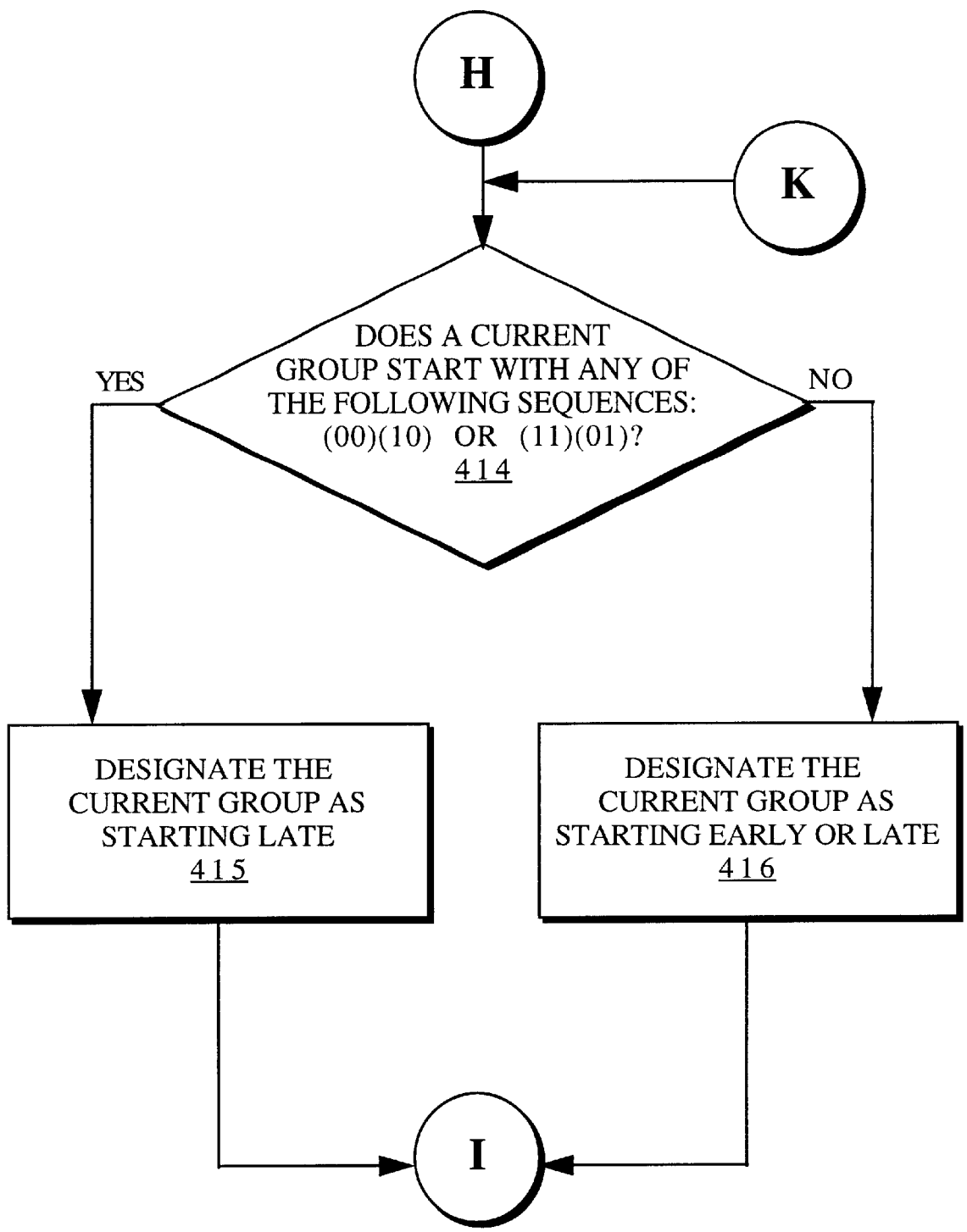
Figure 4H:
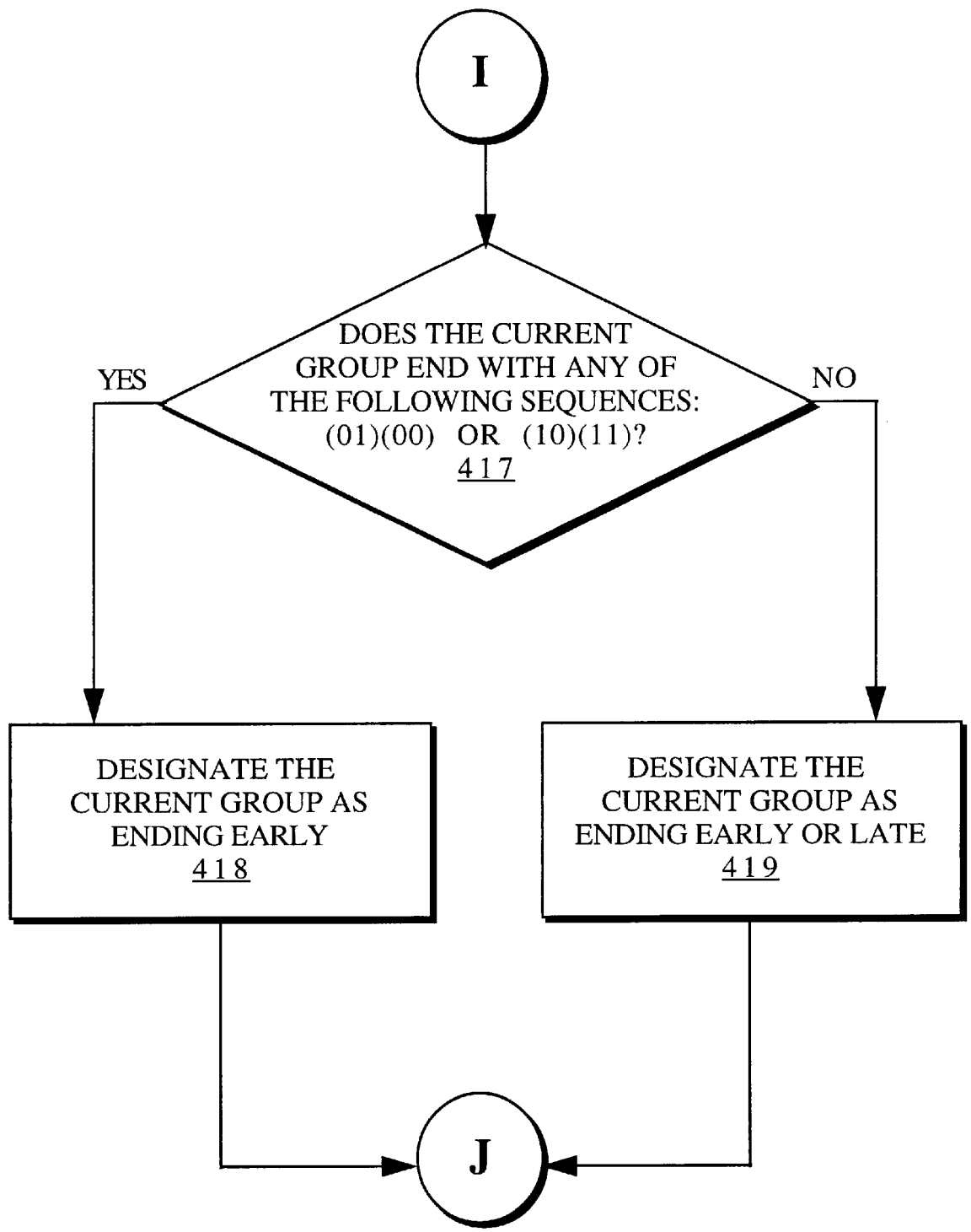
Figure 4I:
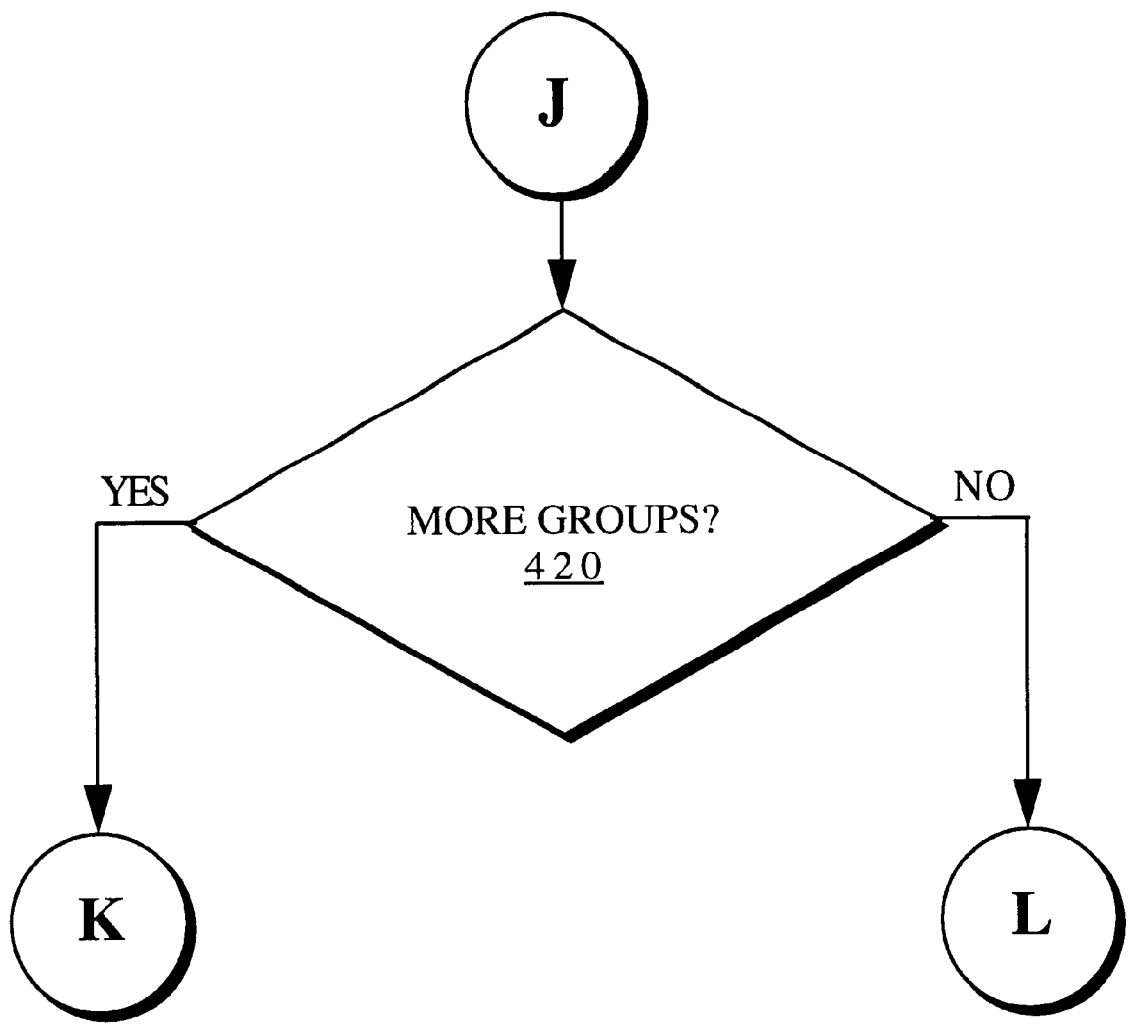

Next, the action of determining whether corresponding first and last sampled data pairs in each group might have been acquired either early or late relative to an associated bit in OUTPUT PATTERN is described in blocks 414 through 419, as shown in FIGS. 4G and 4H. In particular, because each group includes a designated first and last sampled data pair and the designated first and last data pairs might have been acquired either early or late relative to associated bits, there are four possible interpretations for each group; i.e., early-to-early, early-to-late, late-to-early, and late-to-late.

The procedure therefore continues to decision block 414, which is shown in FIG. 4G and determines whether a current group starts with any of the following sampled data pair sequences: (LL)(HL), or (HH)(LH). For example, as shown in TABLE I, logical values of samples 1 and 2 are (LL) and (HL), respectively. As a result, the procedure branches to block 415, which designates the current group as starting late. This means that the first sampled data pair of GROUP C (sample 2) was acquired late relative to an associated bit.

As described above, if a sampled data pair were acquired late relative to an associated bit, then the first element of the sampled data pair would be stored for subsequent analysis. Accordingly, because the first sampled data pair of GROUP C was acquired late, the first element of the first sampled data pair, which has a logical value of "H," would be stored.

It is important to note that if the first sampled data pair of GROUP C were interpreted as occurring early instead, then the second element of the first sampled data pair, which has a logical value of "L," would be stored. This means that the bit associated with the first element and having the logical value "H" would generally not be stored for the subsequent analysis. Because of the high probability that a bit having the logical value "H" is in OUTPUT PATTERN, not storing this logical value would generally leading to erroneous results.

For this reason, groups starting with sampled data pairs having logical values (LL)(HL) or (HH)(LH), where (HL) and (LH) are logical values for the first sampled data pairs in the groups, are interpreted as starting late.

As also shown in TABLE I, logical values of samples 3 and 4 are (LL) and (HH), respectively, where sample 4 is the first sampled data pair of GROUP D. Because the logical values of samples 3 and 4 are neither (LL)(HL) nor (HH)(LH), the procedure branches to block 416, which designates the current group as starting early or late. Accordingly, conclusions cannot be drawn regarding how GROUP D starts; i.e., GROUP D might start either early or late.

As also shown in TABLE I, logical values of samples 7 and 8 are (LL) and (HH), respectively, where sample 8 is the first sampled data pair of GROUP E. Because the logical values of samples 7 and 8 are neither (LL)(HL) nor (HH)(LH), the procedure once again branches to block 416. Accordingly, conclusions cannot be drawn regarding how GROUP E starts; i.e., GROUP E might start either late or early.

After performing the step indicated by either block 415 or 416, the procedure continues to decision block 417, which is shown in FIG. 4H and determines whether the current group ends with any of the following sampled data pair sequences: (LH)(LL) or (HL)(HH).

Groups ending with sampled data pairs having logical values (LH)(LL) or (HL)(HH), where (LH) and (HL) are logical values for the last sampled data pairs in the groups, are interpreted as ending early. Consequently, the second element of the last sampled data pairs in the groups are stored for subsequent analysis. It is also important to note that if these groups were instead interpreted as ending late, then the bit associated with the second element of the last sampled data pairs would generally be missed, thereby leading to erroneous analysis results.

As described above, GROUP C is interpreted as starting late. However, because GROUP C does not end with sampled data pairs having logical values (LH)(LL) or (HL)(HH), the procedure branches to block 419, which generally designates the current group as ending either early or late. Accordingly, conclusions cannot be drawn regarding how GROUP C ends; i.e., GROUP C might end either late or early. There are therefore currently only two possible interpretations for GROUP C; i.e., late-to-early and late-to-late.

Further, logical values of samples 6 and 7 are (LH) and (LL), where sample 6 is the last sampled data pair in GROUP D. For this case, the procedure branches to block 418, which generally designates the current group as ending early. Accordingly, GROUP D is interpreted as ending early. There are therefore currently only two possible interpretations for GROUP D; i.e., early-to-early and late-to-early.

Further, logical values of samples 11 and 12 are (LL) and (HH), respectively, where sample 11 is the last sampled data pair of GROUP E. For this case, the procedure again branches to block 419. Accordingly, because the logical values of samples 11 and 12 are neither (LH) (LL) nor (HL) (HH), conclusions cannot be drawn regarding how GROUP E ends; i.e., GROUP E might end either late or early. There are therefore currently four possible interpretations for GROUP E; i.e., early-to-early, early-to-late, late-to-early, and late-to-late.

After performing the step indicated by either block 418 or 419, the procedure continues to decision block 420, which determines whether the corresponding first and last sampled data pairs of any more groups must be interpreted. If so, the procedure branches back to decision block 414.

Figure 4J:
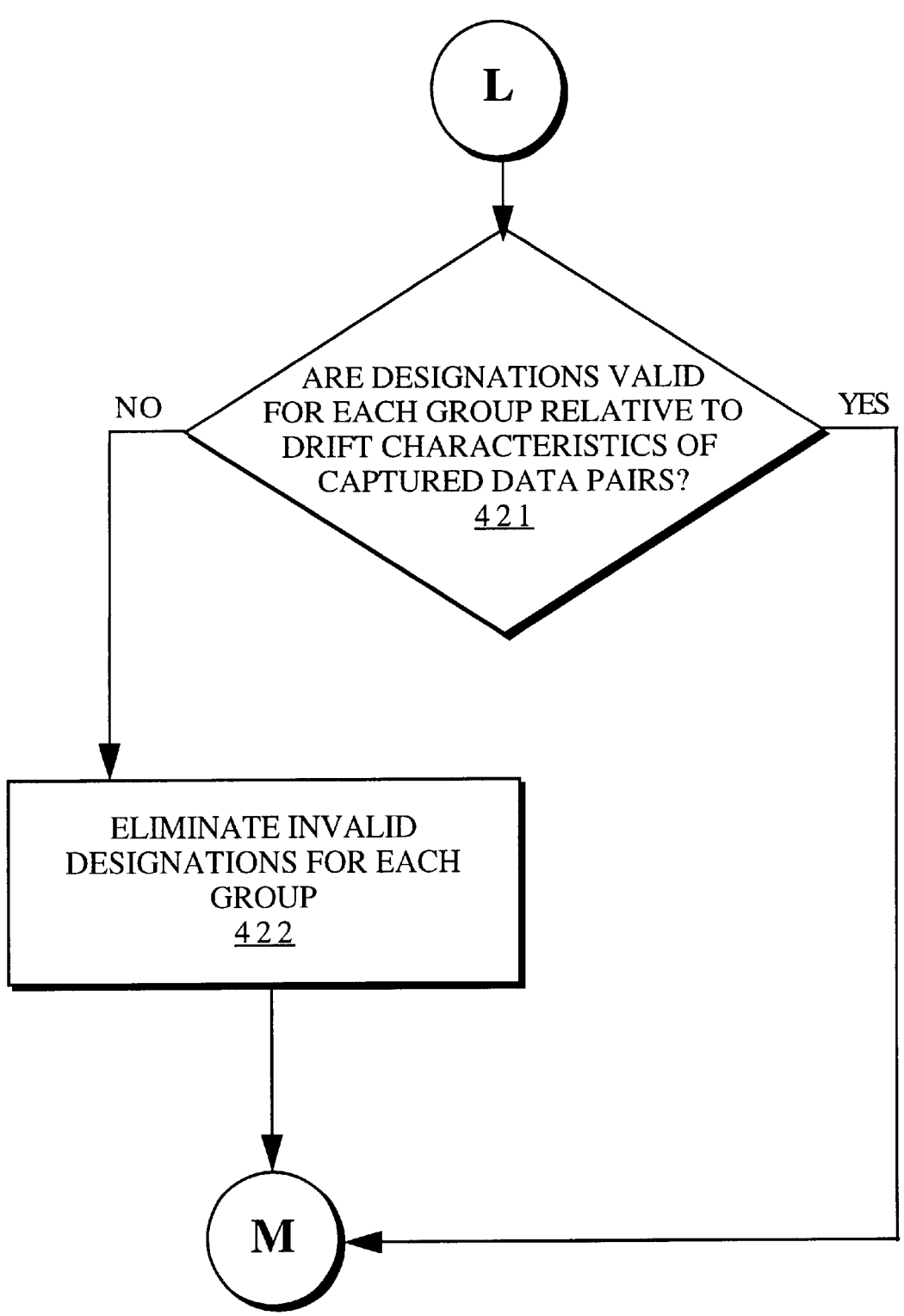
Figure 4K:
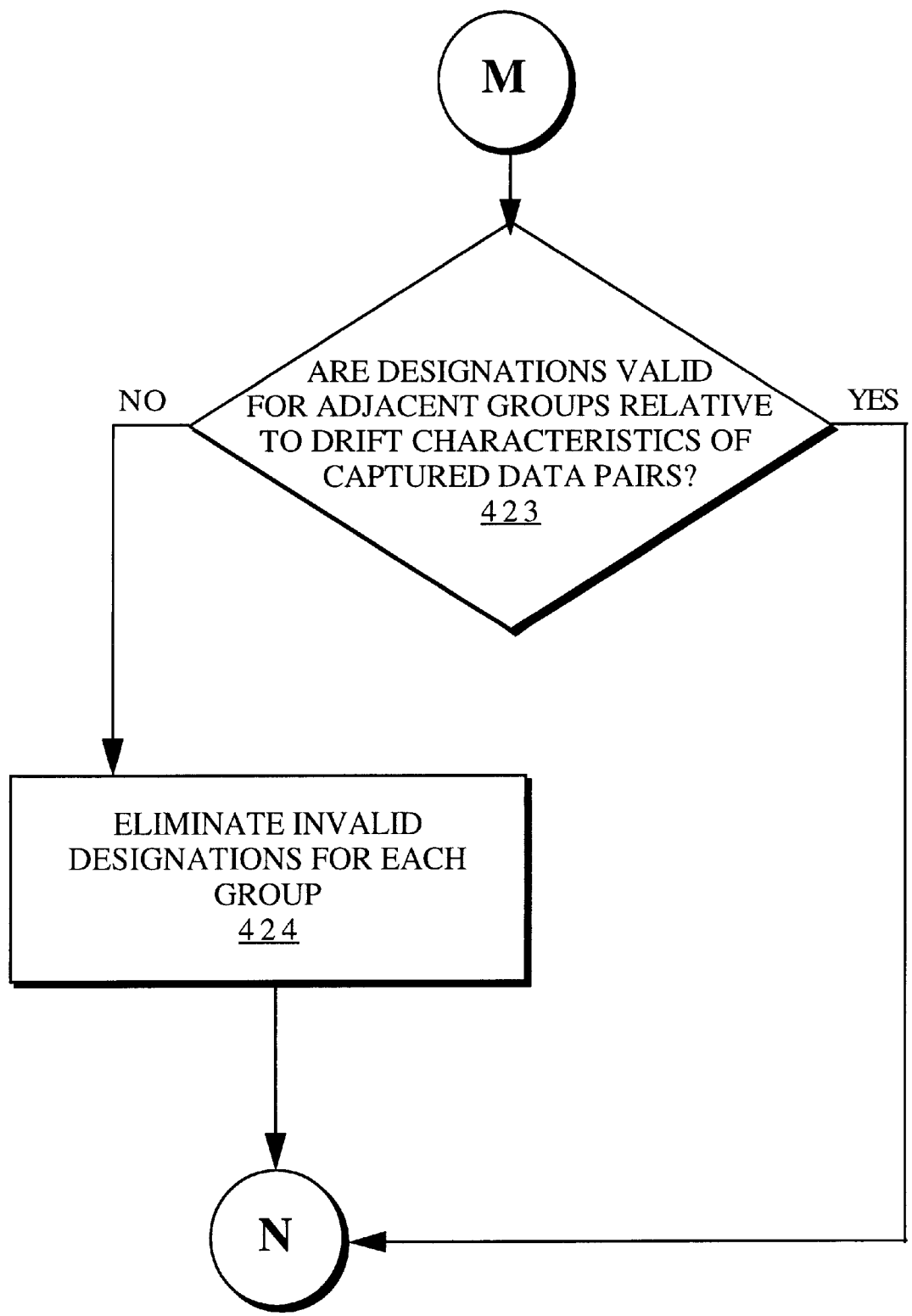
Figure 4L:
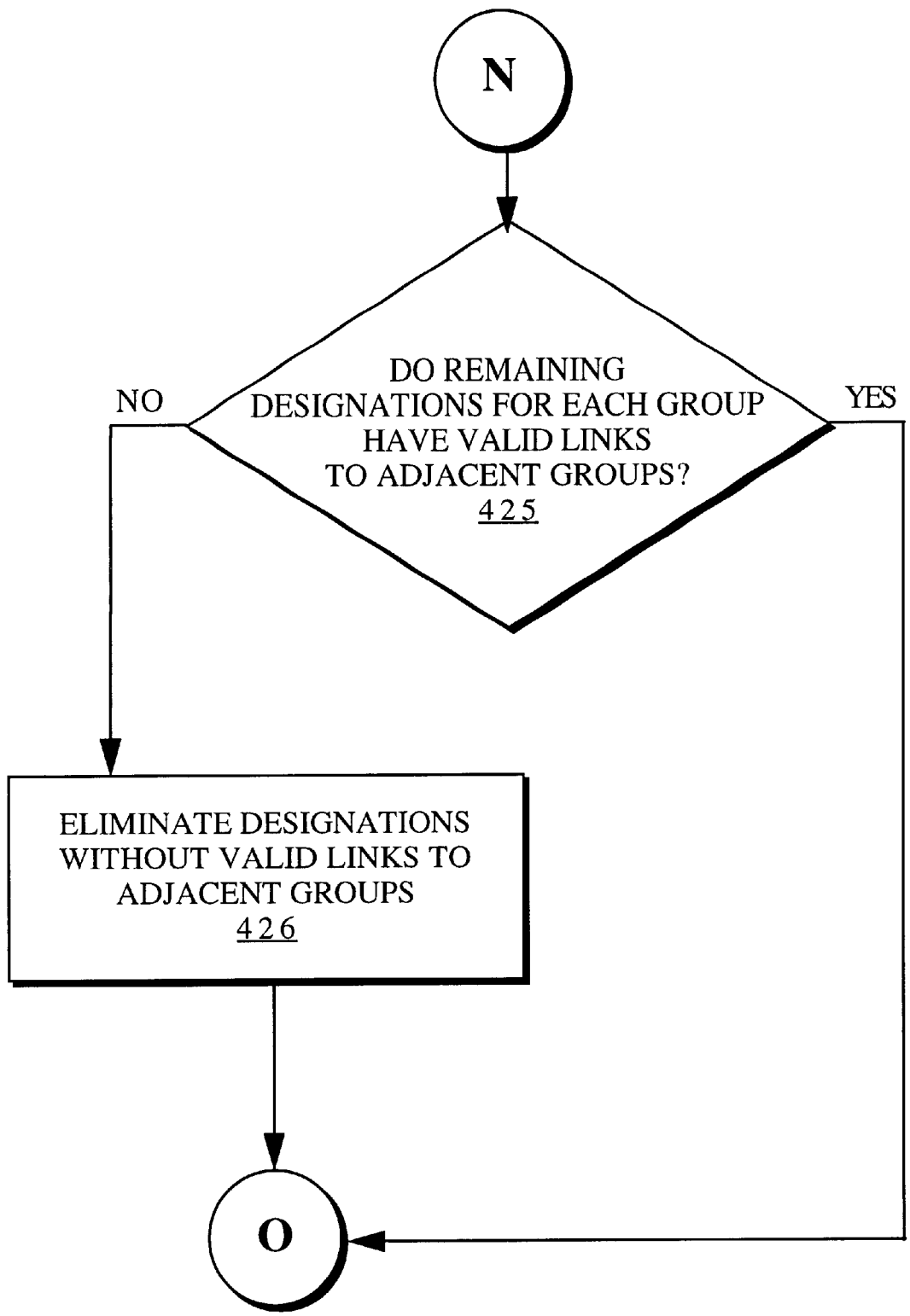

Next, the action of determining whether the designations made in blocks 415, 416, 418, and 419 are valid relative to a current amount of drift is described in blocks 421 through 426, as shown in FIGS. 4J through 4L. In particular, the procedure first branches to decision block 421, which determines whether the designations are valid for each group relative to drift characteristics of captured sampled data pairs.

For example, in the illustrative example described above, where the frequency of EDGE equals 172 MHz and the frequency of OUTPUT PATTERN equals 200 MHz, it was determined that it would take at least three samples to drift from early-to-late or from late-to-early.

If the same drift characteristics exist for the sampled data pairs listed in TABLE I, then it is concluded that GROUP C cannot validly be interpreted as late-to-early. This is because GROUP C consists of only two samples, and at least three samples are required to drift from late-to-early. The procedure therefore branches to block 422, which eliminates invalid designations for each group. Accordingly, the designation, "late-to-early" is eliminated for GROUP C. There is therefore now only one valid interpretation for GROUP C; i.e., late-to-late.

It is also concluded that GROUP D cannot validly be interpreted as early-to-early. This is because there are no samples between GROUPS C and D, and at least three samples are required to drift from GROUP C, which ends late, to GROUP D, which would begin early if it were interpreted as early-to-early. The procedure therefore also branches to block 422 for this case. Accordingly, the designation "early-to-early" is eliminated for GROUP D. There is therefore now only one valid interpretation for GROUP D; i.e., late-to-early.

Similarly, it is concluded that GROUP E cannot validly be interpreted as late-to-late or late-to-early. This is because there is only one sample between GROUPS D and E, and at least three samples are required to drift from GROUP D, which ends early, to GROUP E, which would begin late if it were interpreted as late-to-late or late-to-early. The procedure therefore also branches to block 422 for this case. Accordingly, the designations late-to-late or late-to-early are eliminated for GROUP E. There are therefore now only two valid interpretations for GROUP E; i.e., early-to-early and early-to-late.

Remaining interpretations for GROUPS C, D, and E are summarized in TABLE II below, in which "early" is abbreviated as "E" and "late" is abbreviated as "L."

TABLE II

| GROUP C | GROUP D | GROUP F |
|---------|---------|---------|
| L-to-L  | L-to-E  | E-to-E  |
|         |         | E-to-L  |

After successively eliminating interpretations for some groups, the procedure then branches to decision block 423, which is shown in FIG. 4K and determines whether the remaining designations are valid for adjacent groups relative to the drift characteristics of the captured sampled data pairs.

As shown in TABLE II, GROUP C ends late and GROUP D begins late. Further, GROUP D ends early and GROUP E begins early. Accordingly, the designations are valid for adjacent GROUPS C, D, and E, and the procedure therefore branches to decision block 425 shown in FIG. 4L.

However, if the remaining interpretations for GROUP D were L-to-E and L-to-L, and at least three samples were required to drift from GROUP D, which might end late, to GROUP E, which begins early, then it would be concluded that GROUP D cannot validly be interpreted as L-to-L. This is because only one sample, i.e. sample 7, separates the adjacent GROUPS D and E. The procedure would then branch to block 424, which would eliminate the designation, L-to-L, for GROUP D.

Figure 4M:
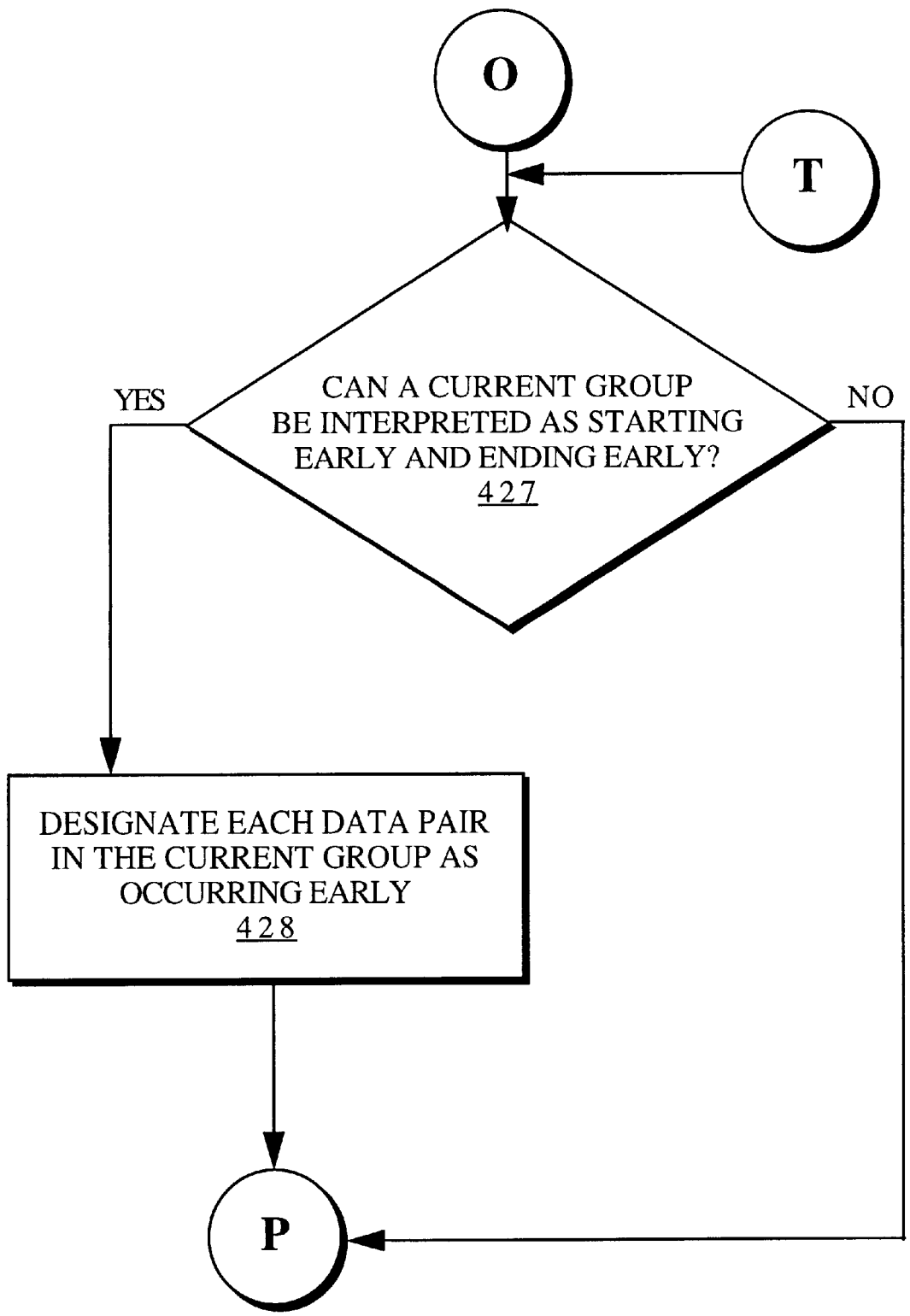

Next, the procedure continues to decision block 425, which is shown in FIG. 4L and determines whether the remaining designations for each group have valid links to adjacent groups. As shown in TABLE II, GROUP C ends late and GROUP D begins late. Further, GROUP D ends early and GROUP E begins early. Because the remaining designations for GROUPS C, D, and E have valid links to adjacent groups, the procedure branches to decision block 427 shown in FIG. 4M.

However, let us assume that the interpretations for GROUP D were L-to-E and L-to-L, and the interpretations for GROUP E were E-to-E, E-to-L, and L-to-L. Further, let us assume that the interpretation, L-to-L, were eliminated for GROUP E in block 424. This would mean that if GROUP D were interpreted as L-to-L, then GROUP D would no longer have a valid link to GROUP E, which would only be interpreted as starting early (assuming, of course, that three samples were required to drift from late-to-early). For this case, the procedure would branch to block 426, which would eliminate the designation, L-to-L, for GROUP D.

Next, the action of designating sampled data pairs in each group as occurring either early or late is described in blocks 427 through 434, as shown in FIGS. 4M through 4P. In particular, the procedure continues to decision block 427, which determines whether a current group can be interpreted as starting early and ending early, i.e. E-to-E. As shown in TABLE II, GROUP E can be interpreted as E-to-E. Accordingly, the procedure branches to block 428 for this case, which designates each sampled data pair in GROUP E as occurring early when GROUP E is interpreted as E-to-E.

Figure 4N:
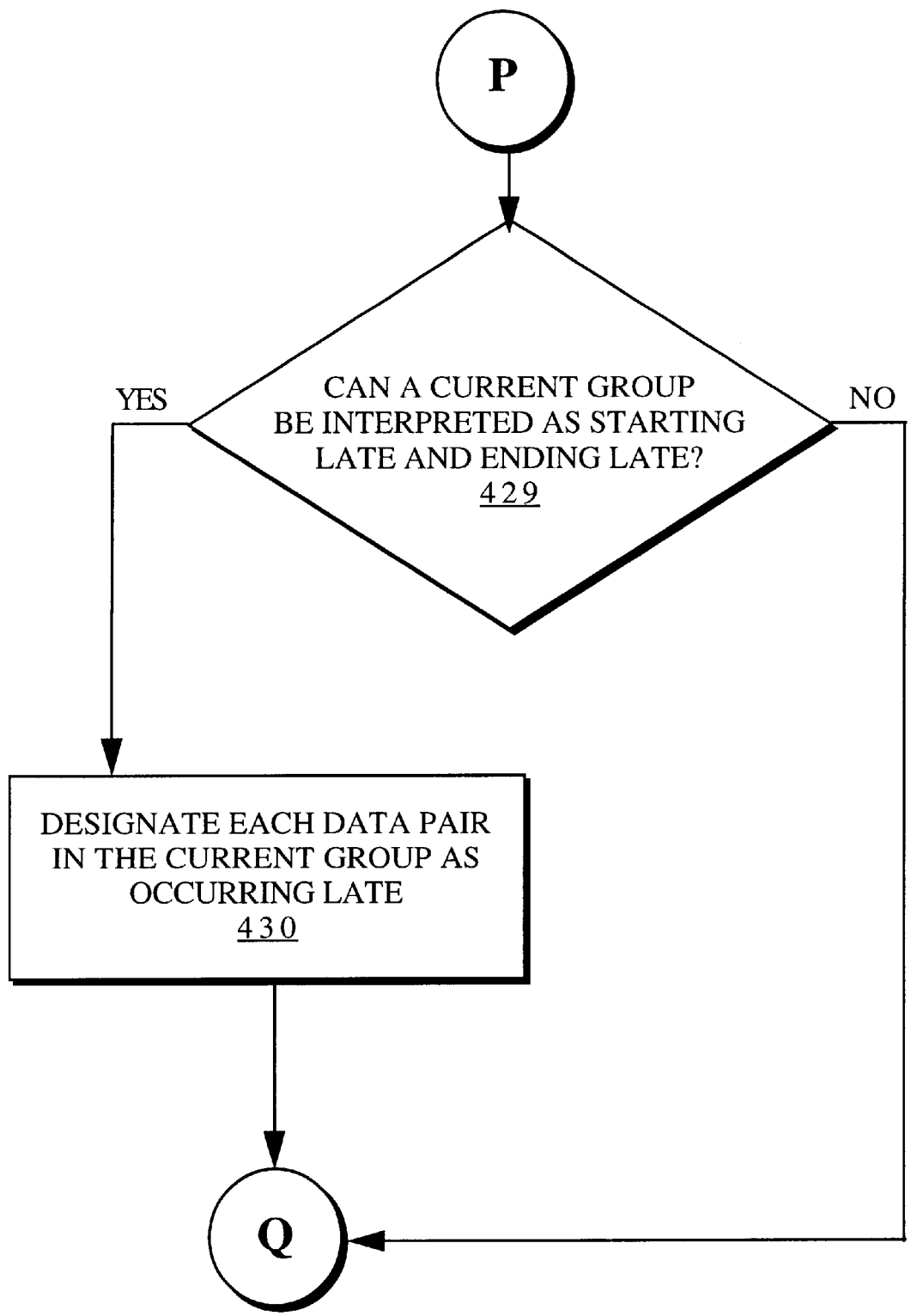

Otherwise, the procedure branches to decision block 429, which is shown in FIG. 4N and determines whether the current group can be interpreted as starting late and ending late, i.e. L-to-L. As shown in TABLE II, GROUP C can be interpreted as L-to-L. Accordingly, the procedure branches to block 430 for this case, which designates each sampled data pair in GROUP C as occurring late when GROUP C is interpreted as L-to-L.

Figure 4O:
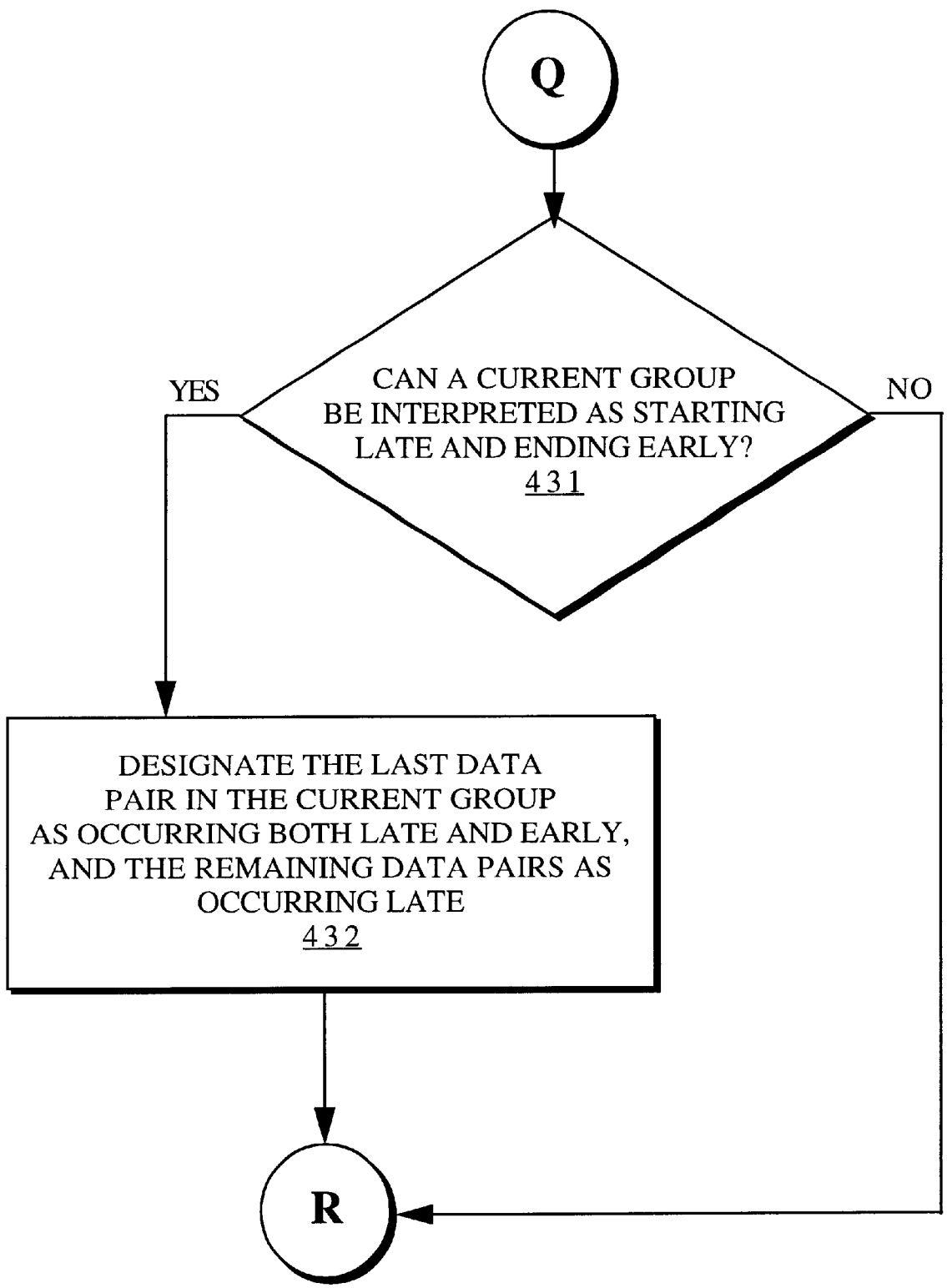

Otherwise, the procedure branches to decision block 431, which is shown in FIG. 4O and determines whether the current group can be interpreted as starting late and ending early, i.e. L-to-E. As shown in TABLE II, GROUP D can be interpreted as L-to-E. Accordingly, the procedure branches to block 432 for this case, which designates each sampled data pair in GROUP D as occurring late when GROUP D is interpreted as L-to-E except for the last sampled data pair in GROUP D, which is interpreted as occurring both late and early.

Figure 4P:
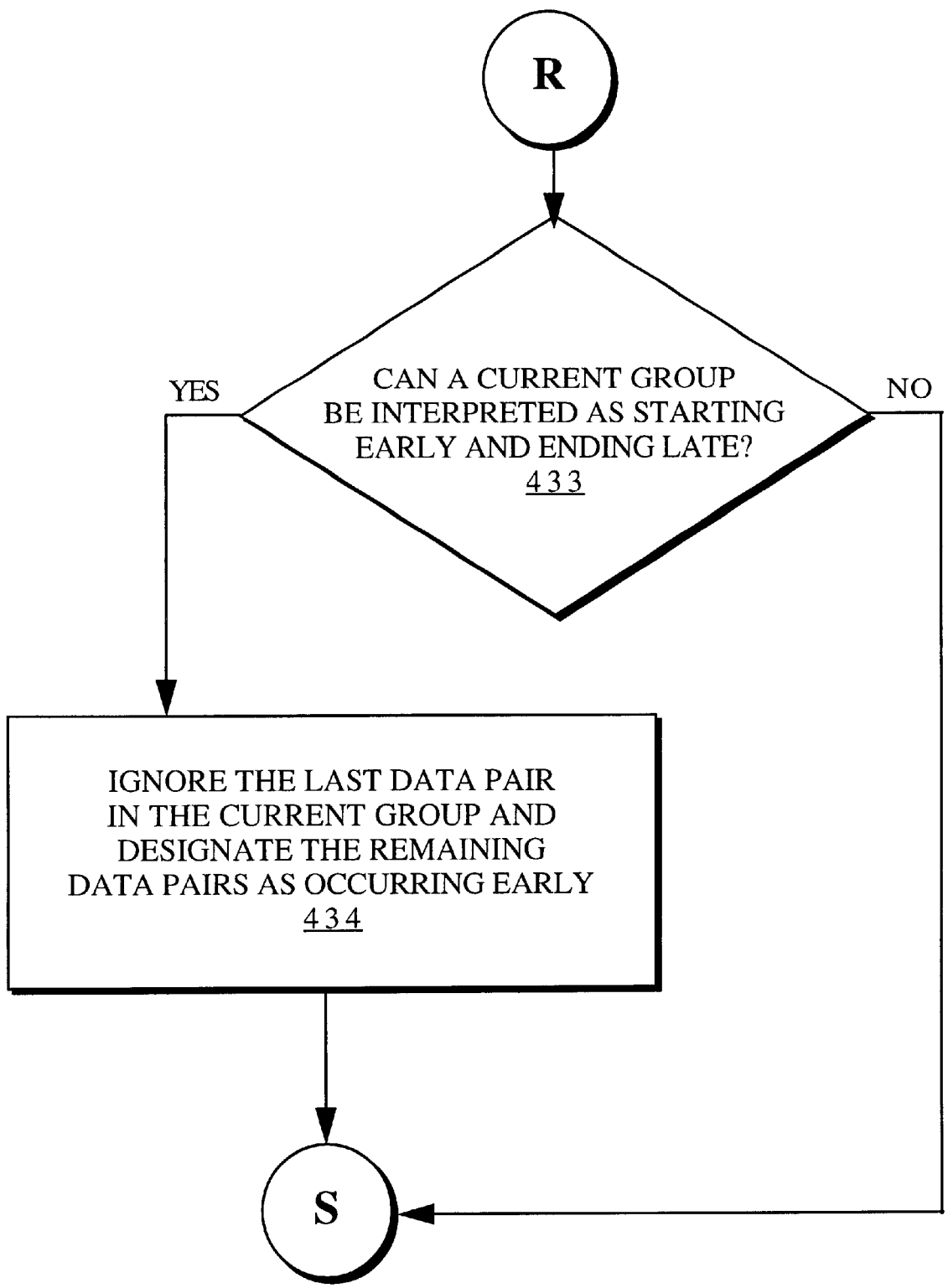

Otherwise, the procedure branches to decision block 433, which is shown in FIG. 4P and determines whether the current group can be interpreted as starting early and ending late, i.e. E-to-L. As shown in TABLE II, GROUP E can be interpreted as E-to-L. Accordingly, the procedure branches to block 434 for this case, which designates each sampled data pair in GROUP E as occurring early when GROUP E is interpreted as E-to-L except for the last sampled data pair in GROUP E, which is ignored.

Figure 4Q:
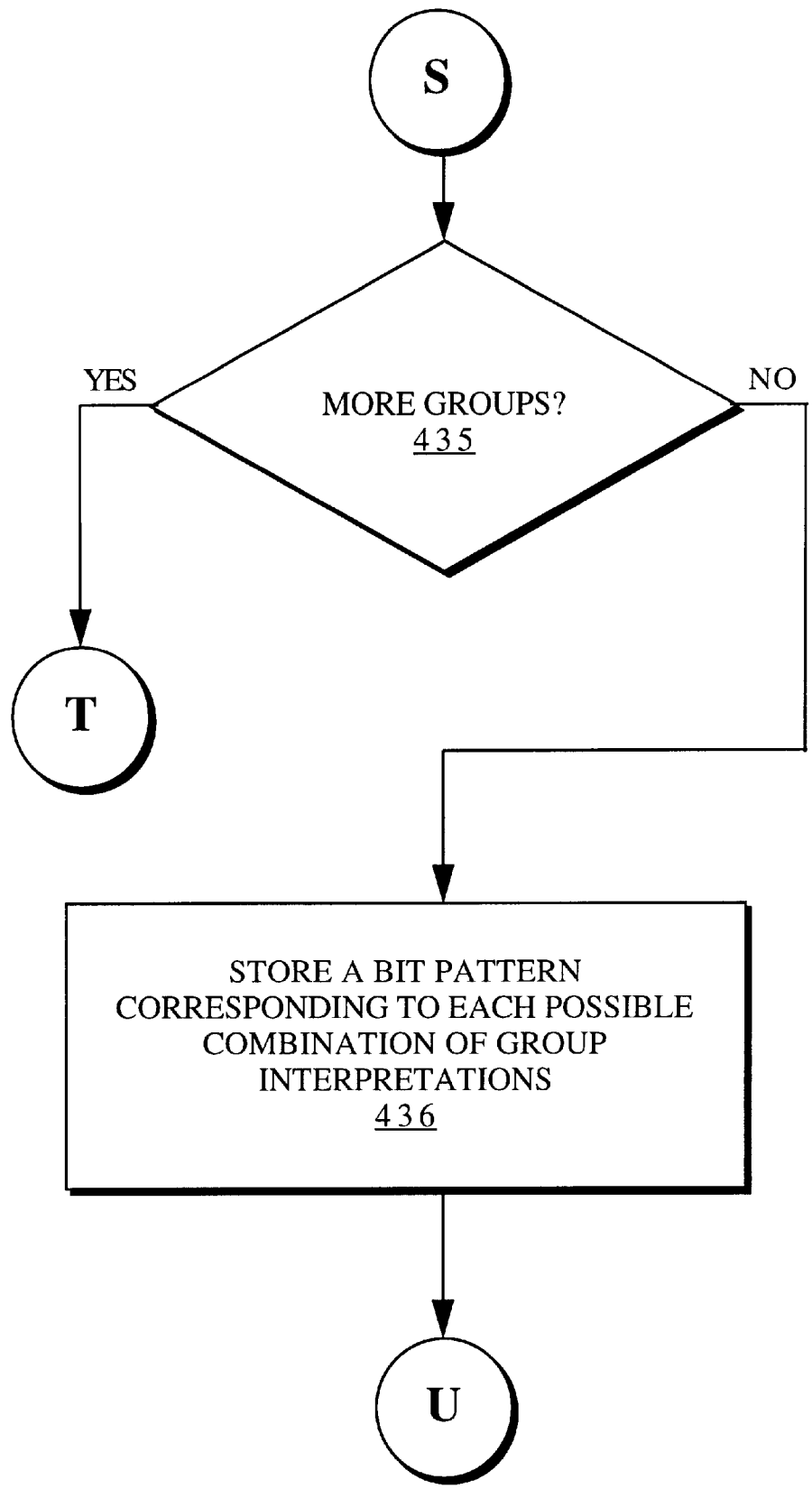

The procedure then continues to decision block 435, which is shown in FIG. 4Q and determines whether there are any more groups to consider. If so, the procedure branches back to decision block 427. If not, the procedure continues to block 436, which stores a bit pattern for subsequent analysis corresponding to each possible combination of group interpretations. Because GROUP C has one remaining interpretation, GROUP D has one remaining interpretation, and GROUP E has two remaining interpretations, two bit patterns are stored for this illustrative example. This is because one bit pattern incorporates the first interpretation for GROUP E, and another bit pattern incorporates the second interpretation for GROUP E.

As described above, if sampled data pairs have logical values (LL) or (HH), then a 0 bit or a 1 bit, respectively, is stored for subsequent analysis. Also, if a group can be interpreted as L-to-E, then each sampled data pair in the group occurs late, except for the last sampled data pair in the group which is viewed as occurring both late and early. Also, if a group can be interpreted as E-to-L, then each sampled data pair in the group occurs early, except for the last sampled data pair in the group which is ignored.

Accordingly, for the logical values of sampled data pairs listed in TABLE I, a 0 bit is stored for both samples 1 and 7, and a 1 bit is stored for samples 12, 13, and 14.

Also, because GROUP C is interpreted as L-to-L, each sampled data pair in GROUP C occurs late. This means that the first element of each sampled data pair in GROUP C, i.e., a 1 bit and a 0 bit, are therefore stored for subsequent analysis.

Also, because GROUP D is interpreted as L-to-E, each sampled data pair in GROUP D occurs late, except for sample 6, which is viewed as occurring both late and early. This means that the first element of each sampled data pair in GROUP D, i.e., a 1 bit, a 1 bit, and a 0 bit, and the second element of sample 6, i.e., a 1 bit, are therefore stored for subsequent analysis.

Also, because GROUP E can be interpreted as E-to-E, each sampled data pair in GROUP E can occur early. This means that the second element of each sampled data pair in GROUP E, i.e., a 1 bit, a 0 bit, a 0 bit, and a 1 bit, can be stored for subsequent analysis.

Finally, because GROUP E can also be interpreted as E-to-L, each sampled data pair in GROUP E can occur early, except for sample 12 which is ignored. This means that the second element of each sampled data pair in GROUP E, i.e., a 1 bit, a 0 bit, a 0 bit, and a 1 bit are therefore stored for subsequent analysis, and sample 12 is ignored.

Figure 4R:
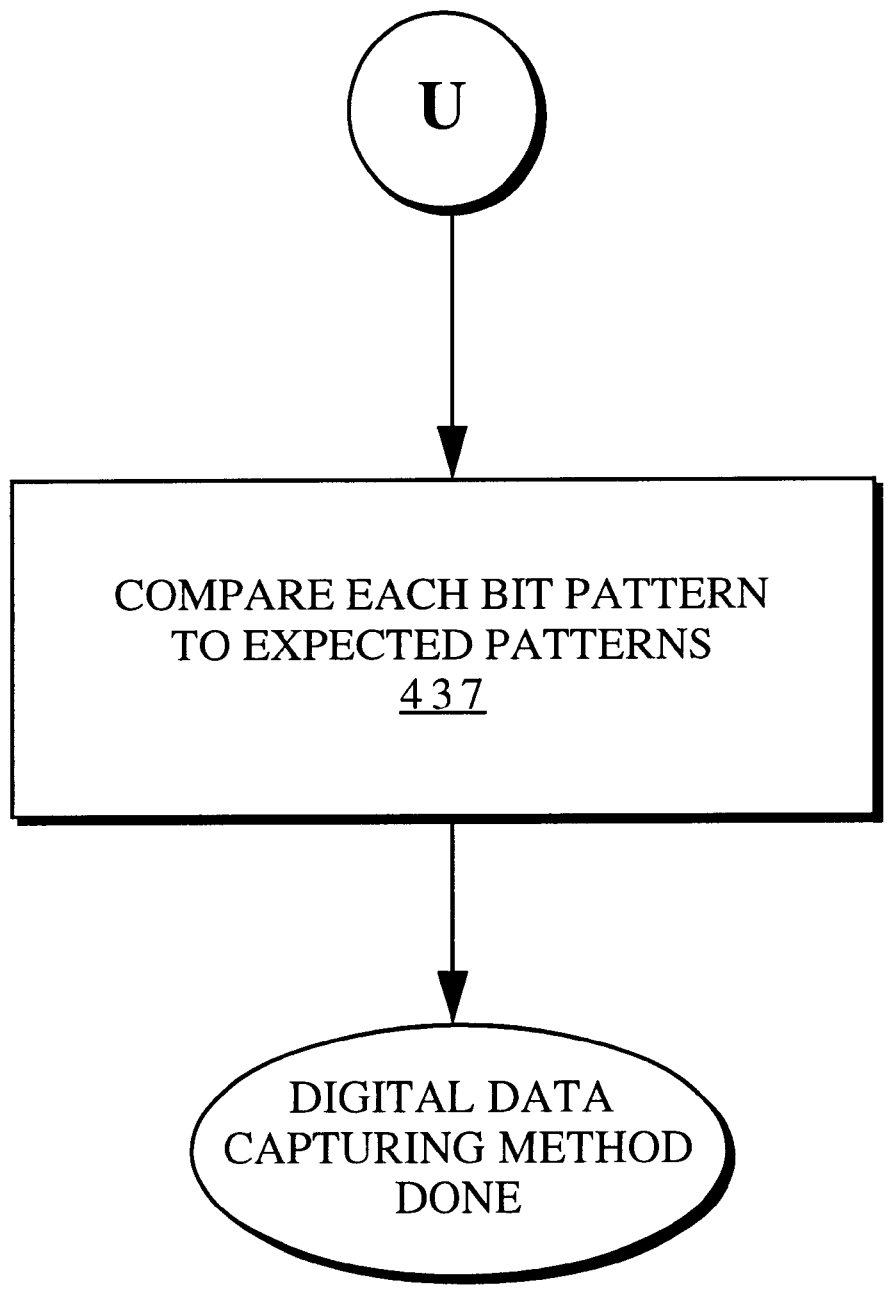

The procedure then compares possible bit patterns with expected bit patterns in block 437, which is shown in FIG. 4R. For example, there are two possible bit patterns for the sampled data pairs listed in TABLE I; i.e., 0101 1010 1001 111 and 0101 1010 1001 11. These bit patterns are compared with expected bit patterns, which are also typically stored in memory.

It follows from the above description that the present invention offers the several advantages over earlier methods for capturing digital data. First, data is captured in one pass, thereby minimizing test time. Also, there are no uncertain logical values in the bit patterns that are compared with the expected bit patterns. This means that the present invention is not subject to false passes. Also, the present invention can successfully capture both data that is produced at arbitrary times and drifting data. Finally, the present invention minimizes the number of possible bit patterns before comparing them with the expected bit patterns.

Although the present invention has been described with reference to a single preferred embodiment, it will be understood by those skilled in this art that additions, deletions, and modifications can be made to this preferred embodiment, without departing from the spirit and scope of the appended claims.

What is claimed is:

1. A method of operating automatic test equipment to capture digital data produced by a semiconductor device under test, used for determining whether the device under test is functioning properly, comprising:

(a) repetitively sampling the digital data to produce a series of sampled data pairs, each sampled data pair including a first data sample and a second data sample;

(b) assigning each sampled data pair in the series to one of a plurality of groups, each group including a plurality of sampled data pairs;

(c) designating the sampled data pairs in each group as occurring either early or late;

(d) deriving at least one serial bit pattern from contiguous groups of sampled data pairs,
   wherein the at least one serial bit pattern includes logical values of first data samples for each group of sampled data pairs designated as occurring late, and
   wherein the at least one serial bit pattern includes logical values of second data samples for each group of sampled data pairs designated as occurring early; and (e) comparing the at least one derived serial bit pattern with at least one expected serial bit pattern.

2. The method of operating automatic test equipment as recited in claim 1,
   wherein the assigning in step (b) includes the substeps of
   (b1) identifying a first plurality of sampled data pairs wherein the first data sample and the second data sample of each sampled data pair have different logical values, and
   (b2) identifying a second plurality of sampled data pairs wherein the first data sample and the second data sample of each sampled data pair have the same logical value.

3. The method of operating automatic test equipment as recited in claim 2,
   wherein the assigning in step (b) further includes the substeps of
   (b3) identifying sampled data pairs in the first plurality that are preceded by runs having the same logical values as the first data samples in the identified sampled data pairs,
   (b4) identifying sampled data pairs in the second plurality that are part of sufficiently long runs,
   (b5) for each sampled data pair identified in step (b3), designating the last sampled data pair of an associated run as the first sampled data pair of a respective group,
   (b6) designating each remaining sampled data pair in the first plurality as the first sampled data pair of a respective group, and
   (b7) for each sampled data pair identified in step (b4), designating the first sampled data pair in the sufficiently long run as the first sampled data pair of a respective group.

4. The method of operating automatic test equipment as recited in claim 3, wherein the assigning in step (b) further includes the substeps of (b8) identifying designated first sampled data pairs that are followed by sampled data pair sequences having logical values (LL)(HL), (HH)(LH), (LH)(LL), (HL)(HH), (HH)(LL), or (LL)(HH), (b9) identifying designated first sampled data pairs that are followed by sufficiently long runs, (b10) for each designated first sampled data pair identified in step (b8), designating the first sampled data pair in an associated sequence as the last sampled data pair in the respective group, and (b11) for each designated first sampled data pair identified in step (b9), designating the sampled data pair immediately preceding the sufficiently long run as the last sampled data pair in the respective group.

5. The method of operating automatic test equipment as recited in claim 1, wherein the designating in step (c) includes the substeps of (c1) identifying groups that begin with sampled data pair sequences having logical values (LL)(HL) or (HH)(LH), (c2) designating each group identified in step (c1) as starting late, and (c3) designating each remaining group as starting late or early.

6. The method of operating automatic test equipment as recited in claim 5, wherein the designating in step (c) further includes the substeps of (c4) identifying groups that end with sampled data pair sequences having logical values (LH)(LL) or (HL)(HH), (c5) designating each group identified in step (c4) as ending early, and (c6) designating each remaining group as ending early or late.

7. The method of operating automatic test equipment as recited in claim 6, wherein the designating in step (c) further includes the substeps of (c7) counting the number of sampled data pairs in each group, (c8) counting the number of sampled data pairs between adjacent groups, and (c9) determining whether the designations made in steps (c2), (c3), (c5), and (c6) are valid based on the number of sampled data pairs in each group and the number of sampled data pairs between adjacent groups.

8. The method of operating automatic test equipment as recited in claim 1, wherein the deriving in step (d) includes the substeps of (d1) identifying groups that start early and end early, (d2) identifying groups that start late and end late, (d3) identifying groups that start late and end early, (d4) identifying groups that start early and end late, (d5) designating the sampled data pairs in each group identified in step (d1) as occurring early, (d6) designating the sampled data pairs in each group identified in step (d2) as occurring late, (d7) designating the last sampled data pair in each group identified in step (d3) as occurring late and early and designating the remaining sampled data pairs as occurring late, and (d8) designating the sampled data pairs in each group identified in step (d4) as occurring early and ignoring the last sampled data pair.

9. A method of operating automatic test equipment to capture drifting digital data produced by a device under test, comprising:

(a) repetitively sampling the digital data to produce a series of sampled data pairs, each sampled data pair including a first data sample and a second data sample;

(b) assigning each sampled data pair in the series to one of a plurality of groups, each group including a plurality of sampled data pairs;

(c) designating corresponding first and last sampled data pairs in each group as having been acquired either early or late relative to an associated bit in the digital data;

(d) determining whether the designations of step (c) are valid relative to a measured amount of drift, and eliminating invalid designations;

(e) designating corresponding sampled data pairs in each group as having been acquired either early or late relative to an associated bit in the digital data based on the valid designations of step (c);

(f) deriving at least one serial bit pattern from contiguous groups of sampled data pairs; and (g) comparing the at least one derived serial bit pattern with at least one expected serial bit pattern.

10. The method of operating automatic test equipment to capture drifting digital data as recited in claim 9, wherein the assigning of step (b) includes the substeps of (b1) identifying sampled data pairs that occur during bit transitions, (b2) for the sampled data pairs identified in step (b1) that are preceded by runs having the same logical values as the first data samples of the identified sampled data pairs, designating the last sampled data pairs in the runs as the first sampled data pairs of respective groups, and (b3) for the sampled data pairs identified in step (b1) that are not preceded by runs having the same logical values as the first data samples of the identified sampled data pairs, designating the identified sampled data pairs as the first sampled data pairs of respective groups.

11. The method of operating automatic test equipment to capture drifting digital data as recited in claim 10, wherein the assigning of step (b) further includes the substeps of (b4) identifying sampled data pairs that do not occur during bit transitions, and (b5) for the sampled data pairs identified in step (b4) that are part of sufficiently long runs, designating the first sampled data pairs in the runs as the first sampled data pairs of respective groups.

12. The method of operating automatic test equipment to capture drifting digital data as recited in claim 11, wherein the assigning of step (b) further includes the substeps of (b6) for the sampled data pairs identified in steps (b1) and (b4) that are followed by sampled data pair sequences having logical values (LL)(HL), (HH)(LH), (LH)(LL), (HL)(HH), (HH)(LL), or (LL)(HH), designating the first sampled data pairs in the sequences as the last sampled data pairs of the respective groups, and (b7) for the sampled data pairs identified in steps (b1) and (b4) that are followed by sufficiently long runs, designating the sampled data pairs immediately before the runs as the last sampled data pairs of the respective groups.

13. The method of operating automatic test equipment to capture drifting digital data as recited in claim 12, wherein the assigning of step (b) further includes the substep of (b8) assigning the sampled data pairs between each designated first sampled data pair and last sampled data pair to the same respective groups.

14. The method of operating automatic test equipment to capture drifting digital data as recited in claim 9, wherein the designating of step (c) includes the substeps of (c1) identifying groups that start with sampled data pair sequences having logical values (LL)(HL) or (HH)(LH), (c2) identifying groups that end with sampled data pair sequences having logical values (LH)(LL) or (HL)(HH), (c3) designating the groups identified in step (c1) as starting late, (c4) designating remaining groups as starting early or late, (c5) designating the groups identified in step (c2) as ending early, and (c6) designating remaining groups as ending early or late.

15. The method of operating automatic test equipment to capture drifting digital data as recited in claim 9, wherein the measured amount of drift is proportional to either the minimum number of sampled data pairs between a first sampled data pair designated as having been acquired early and a second sampled data pair designated as having been acquired late, or the minimum number of sampled data pairs between a third sampled data pair designated as having been acquired late and a fourth sampled data pair designated as having been acquired early.

16. The method of operating automatic test equipment to capture drifting digital data as recited in claim 15, wherein the determining of step (d) includes the substeps of (d1) counting the number of sampled data pairs in each group, (d2) counting the number of sampled data pairs between adjacent groups, and (d3) determining whether the designations made in steps (c3), (c4), (c5), and (c6) are valid based on the number of sampled data pairs in each group, the number of sampled data pairs between adjacent groups, and the measured amount of drift.

17. The method of operating automatic test equipment to capture drifting digital data as recited in claim 9, wherein the designating of step (e) includes the substeps of (e1) for each group designated as starting early and ending early, designating each sampled data pair in the group as occurring early, (e2) for each group designated as starting late and ending late, designating each sampled data pair in the group as occurring late, (e3) for each group designated as starting late and ending early, designating the last sampled data pair in the group as occurring late and early and the remaining sampled data pairs as occurring late, and (e4) for each group designated as starting early and ending late, ignoring the last sampled data pair in the group and designating the remaining sampled data pairs as occurring early.

18. The method of operating automatic test equipment to capture drifting digital data as recited in claim 9, wherein the deriving in step (f) includes the substeps of (f1) storing the first data sample and ignoring the second data sample of each sampled data pair designated as occurring late, (f2) storing the second data sample and ignoring the first data sample of each sampled data pair designated as occurring early, and (f3) storing the first data sample and the second data sample of each sampled data pair designated as occurring late and early.

\* \* \* \* \*